(12) United States Patent
Matsunaga

(10) Patent No.: US 7,709,881 B2
(45) Date of Patent: May 4, 2010

(54) SEMICONDUCTOR INTEGRATED CIRCUIT DEVICE

(75) Inventor: Yasuhiko Matsunaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 550 days.

(21) Appl. No.: 11/338,714

(22) Filed: Jan. 25, 2006

(65) Prior Publication Data

US 2006/0284268 A1    Dec. 21, 2006

(30) Foreign Application Priority Data

Jun. 15, 2005    (JP) .............................. 2005-175343

(51) Int. Cl.
*H01L 29/788*    (2006.01)

(52) U.S. Cl. ........................ 257/315; 257/320; 257/390; 257/E29.129; 257/E29.3

(58) Field of Classification Search ................ 257/315, 257/320, 321, 390, 391, E29.129, E29.3, 257/E29.304
See application file for complete search history.

(56) References Cited

U.S. PATENT DOCUMENTS

| 6,197,639 | B1 * | 3/2001 | Lee et al. ..................... 438/258 |
| 6,420,754 | B2 * | 7/2002 | Takahashi et al. ........... 257/326 |
| 6,451,708 | B1 * | 9/2002 | Ha .............................. 438/738 |
| 6,891,246 | B2 | 5/2005 | Aritome |

FOREIGN PATENT DOCUMENTS

| JP | 4-229654 | 8/1992 |
| JP | 2000-82805 | 3/2000 |
| JP | 2003-7870 | 1/2003 |
| JP | 2004-158626 | 6/2004 |
| JP | 2004-281662 | 10/2004 |

OTHER PUBLICATIONS

Hung-Cheng Sung, et al., "Novel Single-Poly EEPROM With Damascene Control-Gate Structure", IEEE Electron Device Letters, vol. 26, Oct. 2005, pp. 770-772.

* cited by examiner

*Primary Examiner*—Sue Purvis
*Assistant Examiner*—Leslie Pilar Cruz
(74) *Attorney, Agent, or Firm*—Oblon, Spivak, McClelland, Maier & Neustadt, L.L.P.

(57) ABSTRACT

A control gate includes a first conductive film formed in contact with an inter-gate insulating film and a second conductive film electrically connected to the first conductive film. An inter-level insulating film which insulates first and second stacked gate structures from each other. The inter-level insulating film includes a first insulating film, a second insulating film, and a third insulating film formed between the first and second insulating films. The first insulating film insulates the floating gates from each other and portions of the control gates from each other. The second and third insulating films insulate the other portions of the control gates from each other. The third insulating film has a selective etching ratio with respect to the first and second insulating films.

8 Claims, 32 Drawing Sheets

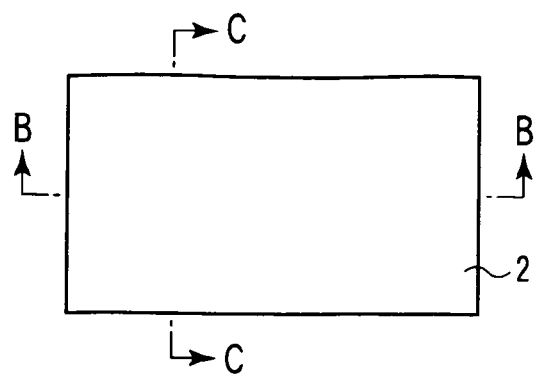
FIG. 1A
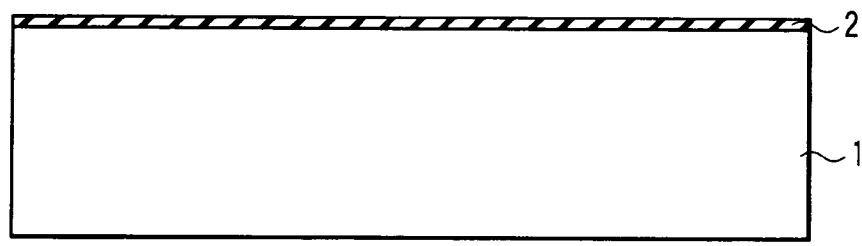
FIG. 1B
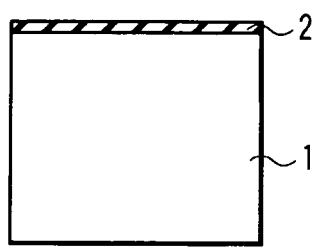 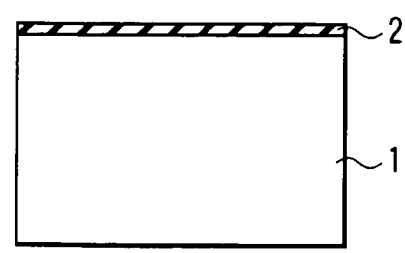
FIG. 1C    FIG. 1D

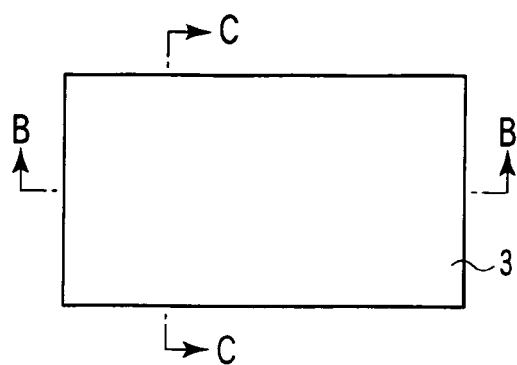
FIG. 2A
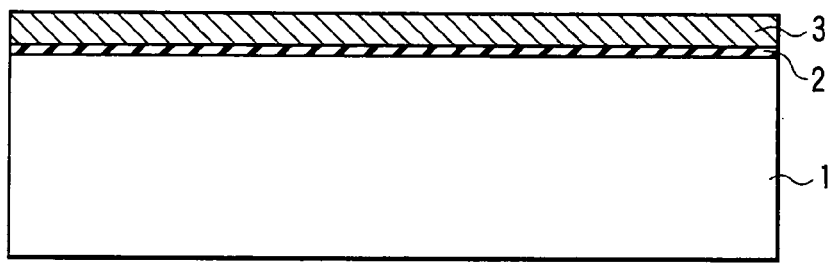
FIG. 2B
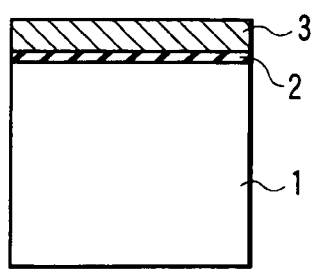 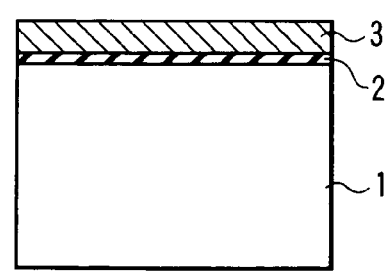
FIG. 2C   FIG. 2D

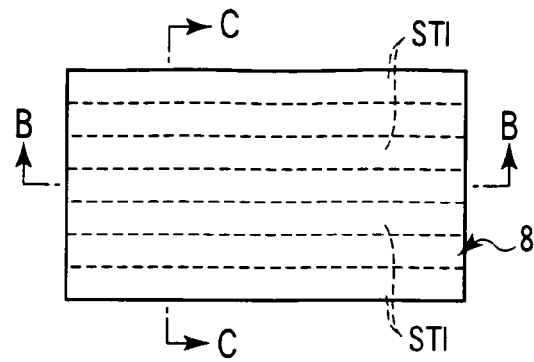
FIG. 6A
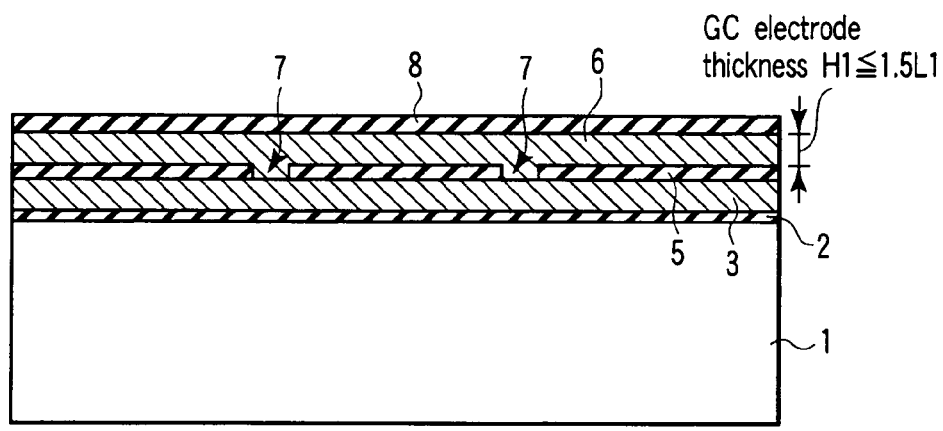
FIG. 6B
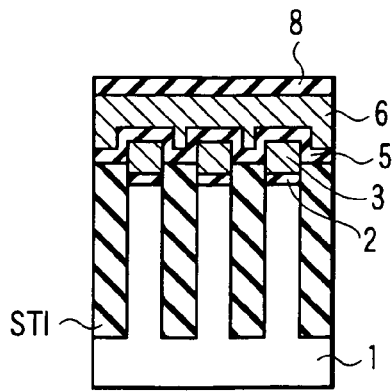 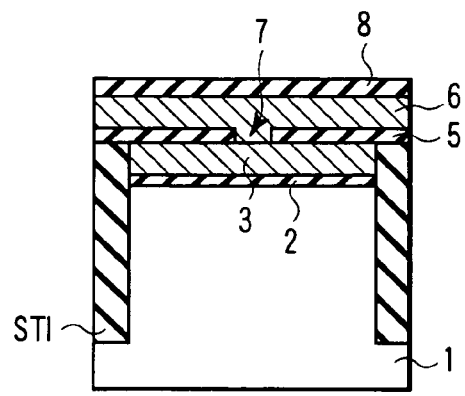
FIG. 6C   FIG. 6D

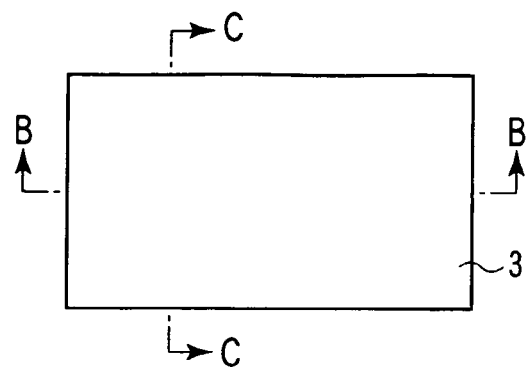
FIG. 20A
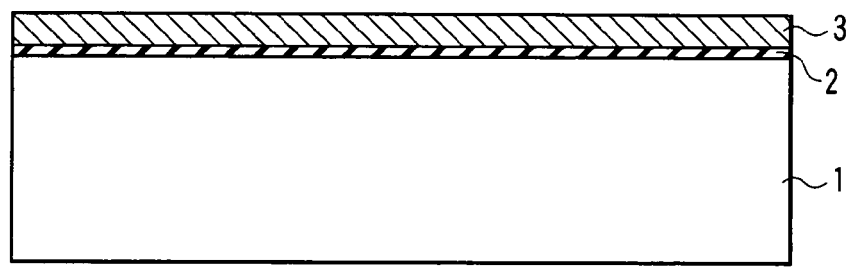
FIG. 20B
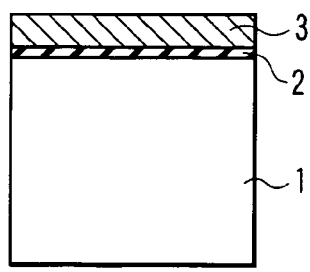     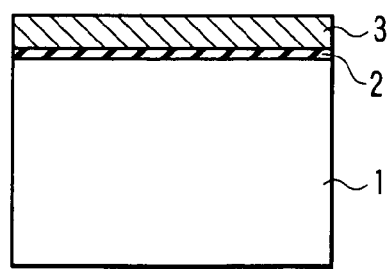
FIG. 20C         FIG. 20D

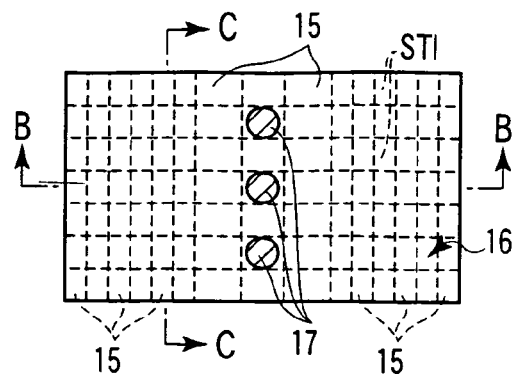
F I G. 29 A
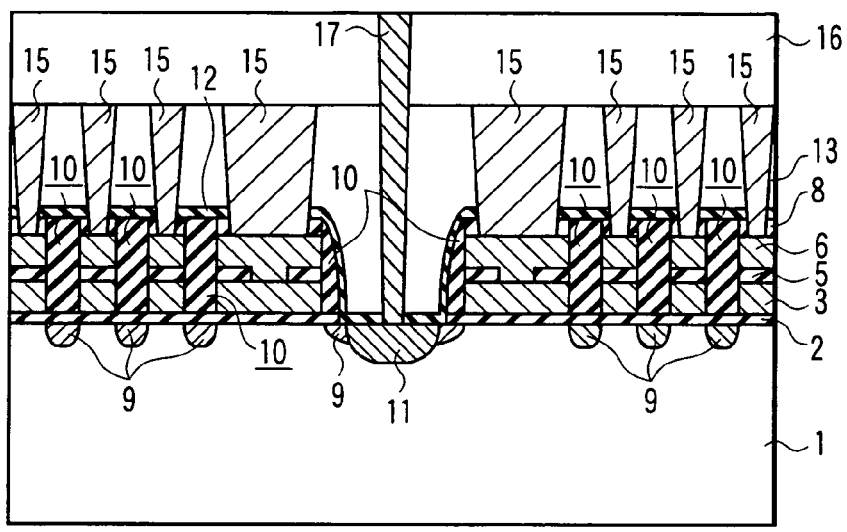
F I G. 29 B
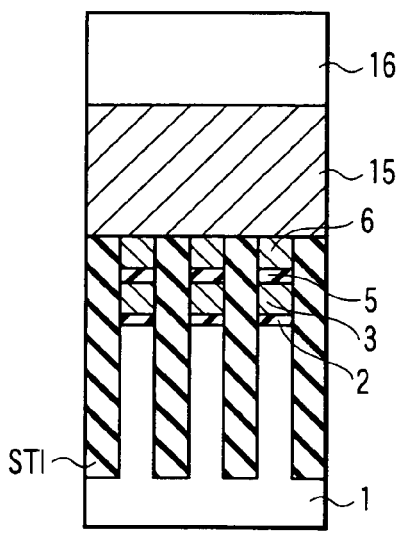
F I G. 29 C
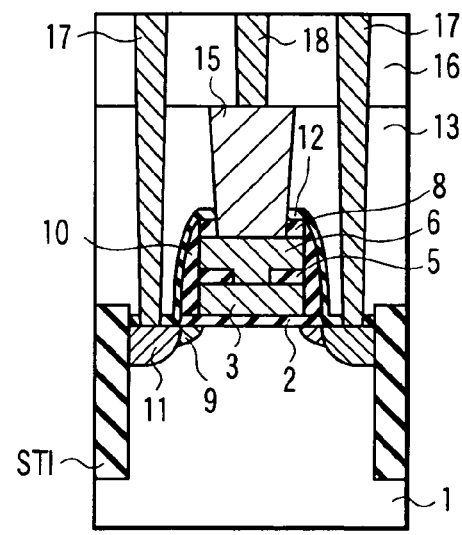
F I G. 29 D

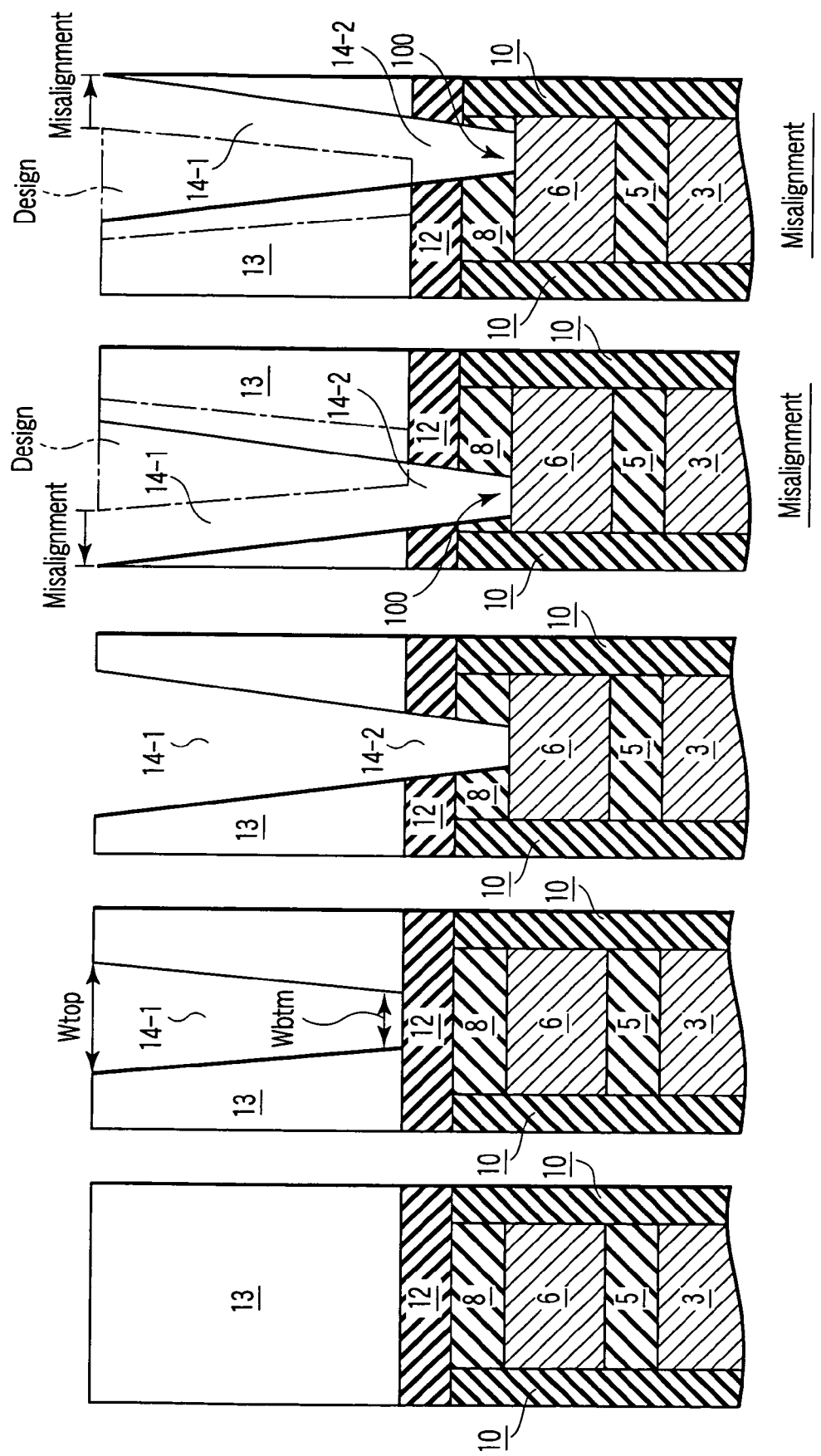

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2005-175343, filed Jun. 15, 2005, the entire contents of which are incorporated herein by reference.

BACKGROUND OF THE INVENTION

1. Field of the Invention

This invention relates to a semiconductor integrated circuit device and more particularly to a semiconductor integrated circuit device having a nonvolatile semiconductor memory device.

2. Description of the Related Art

As a nonvolatile semiconductor memory device, for example, an electrically erasable programmable read only memory (EEPROM) which can electrically program and erase data is known. The EEPROM has a memory cell array configured by memory cells arranged at intersections between word lines extending in a row direction and bit lines extending in a column direction to intersect with the word lines. Generally, in each memory cell, for example, a MOS transistor with a stacked gate structure configured by laminating a floating gate and control gate is used. Particularly, a NAND flash memory has a configuration in which a plurality of memory cell transistors are serially connected to form a NAND string and block selection transistors are arranged on both sides of the NAND string. Further, element isolation regions are arranged in parallel with respect to the active areas of the memory cells to form the memory cell array.

Generally, the word line is formed of a laminated film of conductive polysilicon and metal silicide or a laminated film of conductive polysilicon and metal in order to lower the resistance thereof. Such a NAND flash memory is described in Jpn. Pat. Appln. KOKAI Publication No. 2003-7870, for example.

The NAND flash memory is developed to have a larger scale capacity and rapid shrinkage of the memory cell transistor proceeds accordingly. Particularly, a reduction or shrinkage in the channel length and channel width of the memory cell transistor is significant. Even if they are shrunk, it is desired to suppress the resistance of the word line. This is because it is desired to maintain the high-speed operation of the NAND flash memory. As a result, the gate structure of the memory cell transistor or the so-called stacked gate structure tends to become long in the vertical direction. This is called a high aspect ratio stacked gate structure. At present, the aspect ratio of the stacked gate structure ranges from 7 to 7.5.

Thus, in order to enhance the integration density of the memory cell transistors while suppressing an increase in the resistance of the word line, the aspect ratio of the stacked gate structure tends to be made higher. However, in order to attain the high aspect ratio, it becomes difficult to process the stacked gate structure.

BRIEF SUMMARY OF THE INVENTION

A semiconductor integrated circuit device according to an aspect of the present invention comprises a semiconductor substrate; first stacked gate structure formed on the semiconductor substrate and having a floating gate, inter-gate insulating film and control gate; a second stacked gate structure formed on the semiconductor substrate and having a floating gate, inter-gate insulating film and control gate; and an inter-level insulating film formed to insulate the first and second stacked gate structures from each other, the inter-level insulating film including a first insulating film, a second insulating film, and a third insulating film formed between the first and second insulating films and having a selective etching ratio with respect to the first and second insulating films, the first insulating film insulating the floating gates from each other and portions of the control gates from each other, and the second and third insulating films insulating the other portions of the control gates from each other.

BRIEF DESCRIPTION OF THE SEVERAL VIEWS OF THE DRAWING

FIG. 1A is a plan view of a memory cell array of a semiconductor integrated circuit device according to a first embodiment of this invention;

FIG. 1B is a cross sectional view taken along the B-B line of FIG. 1A;

FIG. 1C is a cross sectional view taken along the C-C line of FIG. 1A;

FIG. 1D is a cross sectional view showing a peripheral transistor;

FIG. 2A is a plan view of the memory cell array of the semiconductor integrated circuit device according to the first embodiment of this invention;

FIG. 2B is a cross sectional view taken along the B-B line of FIG. 2A;

FIG. 2C is a cross sectional view taken along the C-C line of FIG. 2A;

FIG. 2D is a cross sectional view showing the peripheral transistor;

FIG. 6A is a plan view of the memory cell array of the semiconductor integrated circuit device according to the first embodiment of this invention;

FIG. 6B is a cross sectional view taken along the B-B line of FIG. 6A;

FIG. 6C is a cross sectional view taken along the C-C line of FIG. 6A;

FIG. 6D is a cross sectional view showing the peripheral transistor;

FIG. 20A is a plan view of a memory cell array of a semiconductor integrated circuit device according to a third embodiment of this invention;

FIG. 20B is a cross sectional view taken along the B-B line of FIG. 20A;

FIG. 20C is a cross sectional view taken along the C-C line of FIG. 20A;

FIG. 20D is a cross sectional view showing a peripheral transistor;

FIG. 29A is a plan view of the memory cell array of the semiconductor integrated circuit device according to the third embodiment of this invention;

FIG. 29B is a cross sectional view taken along the B-B line of FIG. 29A;

FIG. 29C is a cross sectional view taken along the C-C line of FIG. 29A;

FIG. 29D is a cross sectional view showing the peripheral transistor;

FIGS. 31A to 31E are cross sectional views showing the technical idea of an embodiment of this invention.

DETAILED DESCRIPTION OF THE INVENTION

Figure 3A:
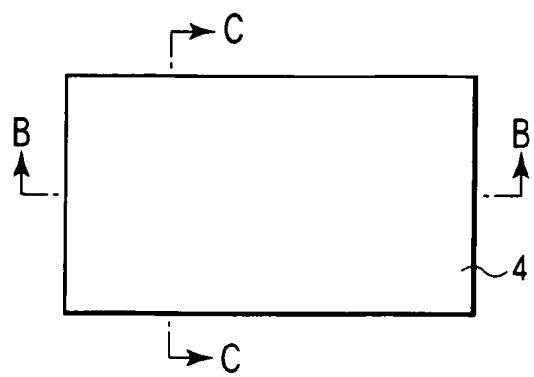
FIG. 3A is a plan view of the memory cell array of the semiconductor integrated circuit device according to the first embodiment of this invention.
Figure 3B:
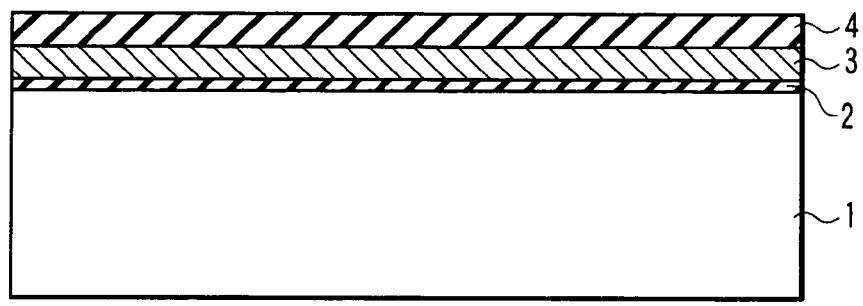
FIG. 3B is a cross sectional view taken along the B-B line of FIG. 3A.
Figure 3C:
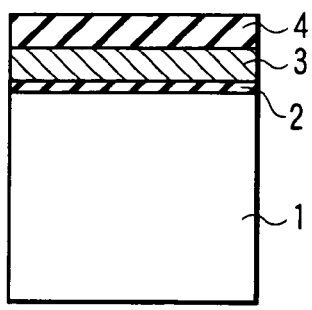
FIG. 3C is a cross sectional view taken along the C-C line of FIG. 3A.
Figure 3D:
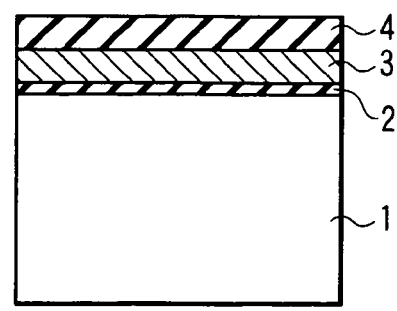
FIG. 3D is a cross sectional view showing the peripheral transistor.
Figure 4A:
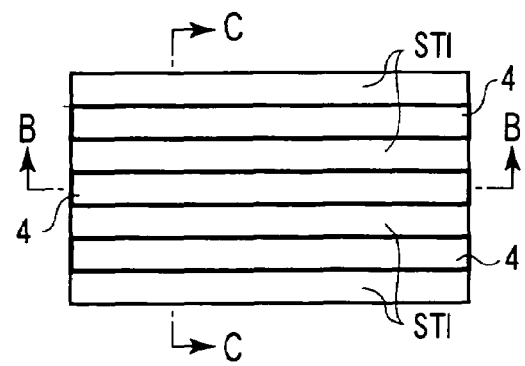
FIG. 4A is a plan view of the memory cell array of the semiconductor integrated circuit device according to the first embodiment of this invention.
Figure 4B:
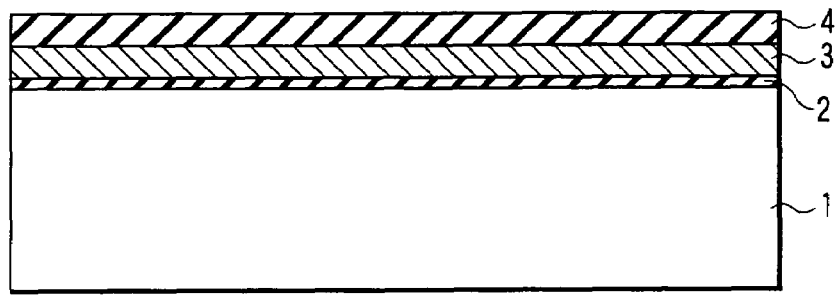
FIG. 4B is a cross sectional view taken along the B-B line of FIG. 4A.
Figures 4C, 4D:
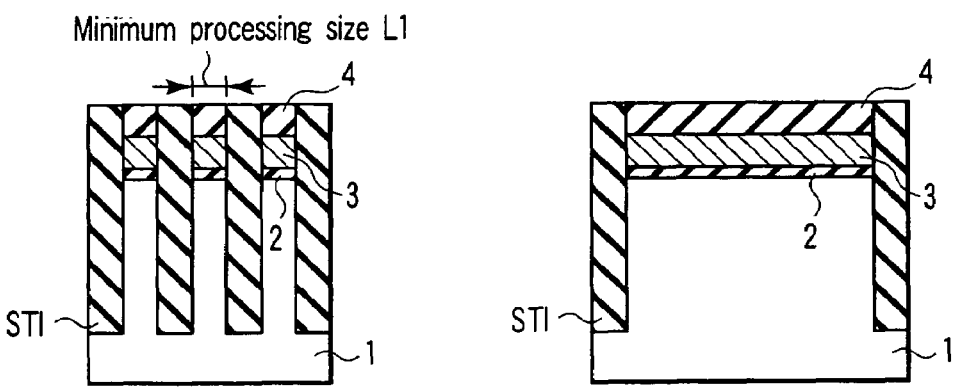
FIG. 4C is a cross sectional view taken along the C-C line of FIG. 4A.
FIG. 4D is a cross sectional view showing the peripheral transistor.
Figure 5A:
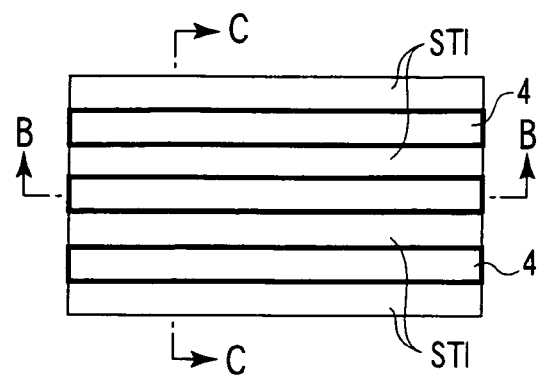
FIG. 5A is a plan view of the memory cell array of the semiconductor integrated circuit device according to the first embodiment of this invention.
Figure 5B:
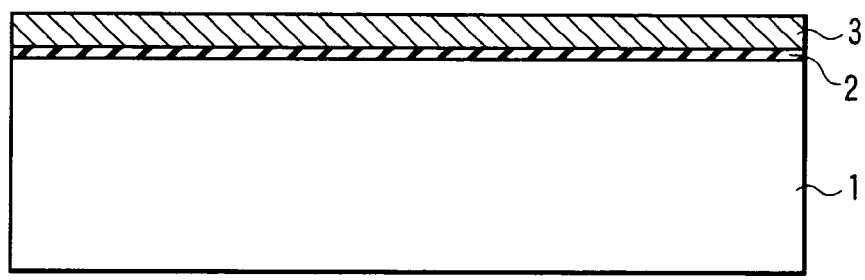
FIG. 5B is a cross sectional view taken along the B-B line of FIG. 5A.
Figures 5C, 5D:
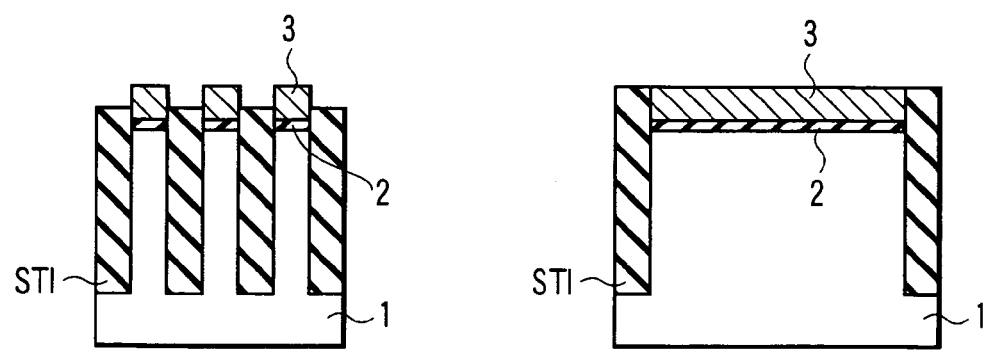
FIG. 5C is a cross sectional view taken along the C-C line of FIG. 5A.
FIG. 5D is a cross sectional view showing the peripheral transistor.
Figure 7A:
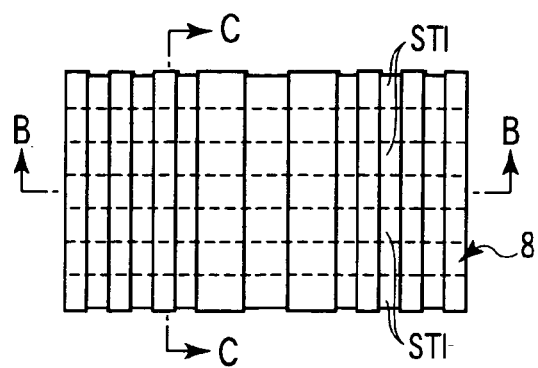
FIG. 7A is a plan view of the memory cell array of the semiconductor integrated circuit device according to the first embodiment of this invention.
Figure 7B:
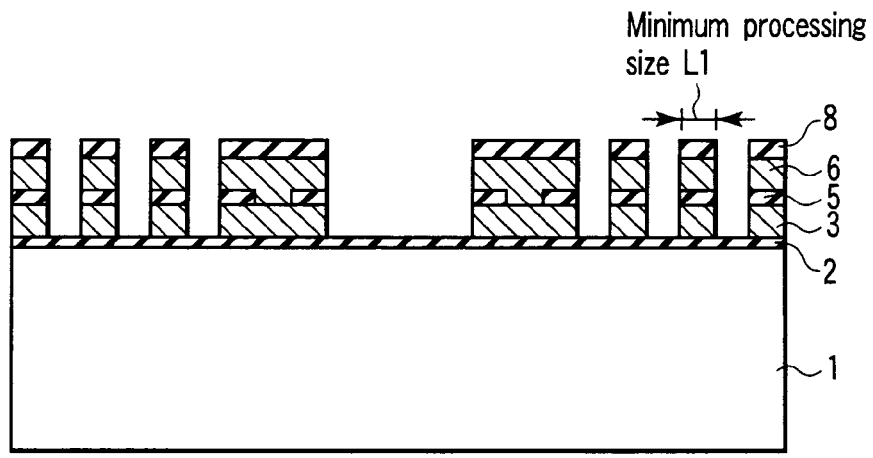
FIG. 7B is a cross sectional view taken along the B-B line of FIG. 7A.
Figures 7C, 7D:
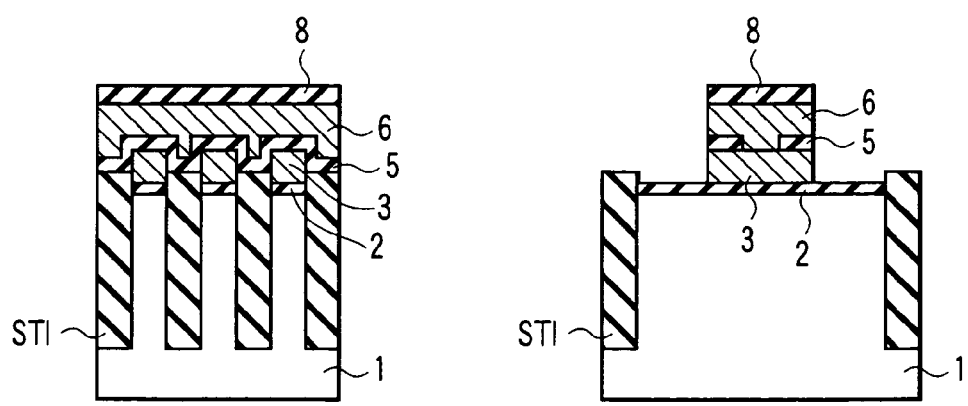
FIG. 7C is a cross sectional view taken along the C-C line of FIG. 7A.
FIG. 7D is a cross sectional view showing the peripheral transistor.
Figure 8A:
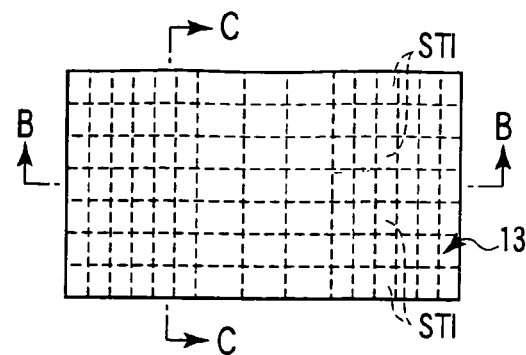
FIG. 8A is a plan view of the memory cell array of the semiconductor integrated circuit device according to the first embodiment of this invention.
Figure 8B:
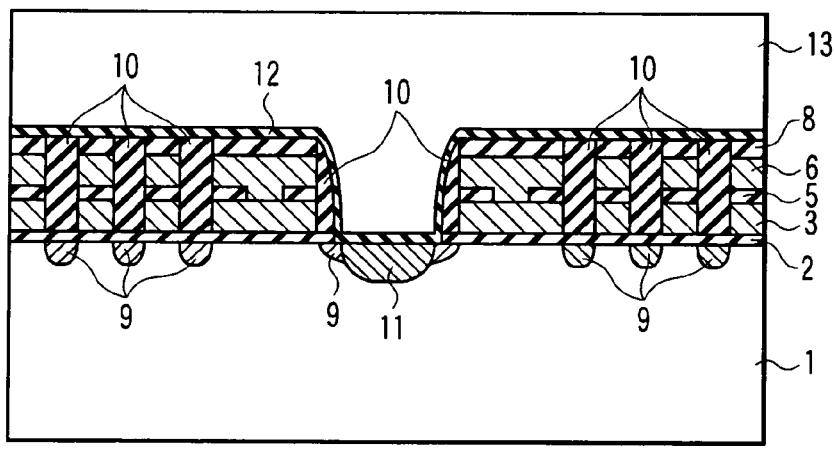
FIG. 8B is a cross sectional view taken along the B-B line of FIG. 8A.
Figure 8C:
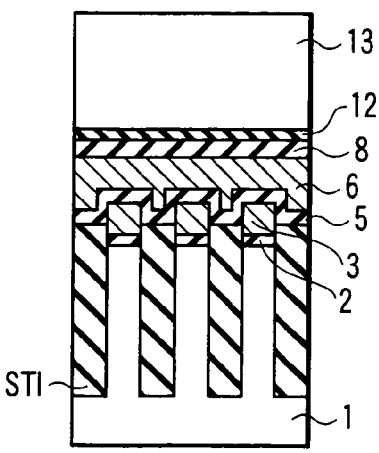
FIG. 8C is a cross sectional view taken along the C-C line of FIG. 8A.
Figure 8D:
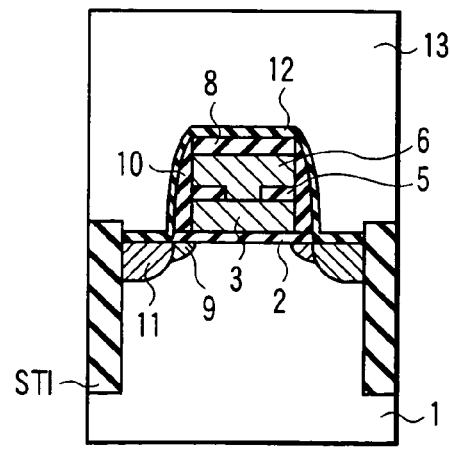
FIG. 8D is a cross sectional view showing the peripheral transistor.

There will now be described embodiments of this invention with reference to the accompanying drawings. In this explanation, common reference symbols are attached to like portions throughout the drawings. In this case, it should be noted that the drawings are schematically drawn, and the relation between the thickness and plane dimension and the ratios of the thicknesses of respective layers are different from the actual cases. Therefore, the concrete thicknesses and dimensions are determined by taking the following explanation into consideration. Further, it is of course understood that the relation and ratio between the dimensions in the different drawings may be different.

Further, first to third embodiments of this invention described below show devices and methods as examples to embody the technical idea of the present invention and the technical idea of the present invention does not limit the materials, shapes, structures and arrangement of the constituents. Further, the technical idea of the present invention can be variously modified without departing from the technical scope in the patent claims described later.

First Embodiment

The first embodiment of this invention is explained together with the manufacturing method thereof.

FIGS. 1A to 11A are plan views each showing a memory cell array of a semiconductor integrated circuit device according to a first embodiment of this invention in each of the main manufacturing steps. FIGS. 1B to 11B are cross sectional views taken along the B-B lines of FIGS. 1A to 11A and FIGS. 1C to 11C are cross sectional views taken along the C-C lines of FIGS. 1A to 11A. FIGS. 1D to 11D are cross sectional views each showing a peripheral transistor of the semiconductor integrated circuit device in each of the main manufacturing steps. In this example, a NAND flash memory is shown. However, all of the embodiments explained in the specification can be applied to an electrically programmable nonvolatile semiconductor memory device other than the NAND flash memory.

First, as shown in FIGS. 1A to 1D, a gate insulating film 2 is formed on the surface of a semiconductor substrate (or well), for example, P-type silicon substrate (or P-well) 1. One example of the gate insulating film 2 is a silicon dioxide film, for example, and is formed by thermally oxidizing the surface of the silicon substrate 1, for example.

Then, as shown in FIGS. 2A to 2D, a conductive material such as conductive polysilicon is deposited on the gate insulating film 2 to form a conductive polysilicon film 3. The conductive polysilicon film 3 is used as floating gates of memory cell transistors later.

Next, as shown in FIGS. 3A to 3D, a cap film which is a silicon nitride film 4 in this example is formed on the conductive polysilicon film 3. For example, the cap film is used as a mask in the etching process when shallow trenches are formed and is used as a stopper in the polishing process when an insulating material is embedded into the shallow trenches. Therefore, as the above material, a material having a selective etching ratio with respect to at least one of the substrate 1 and the insulating material embedded into the shallow trenches. One example of the material is silicon nitride. In this example, silicon nitride is deposited on the conductive polysilicon film 3 to form the silicon nitride film 4.

After this, as shown in FIGS. 4A to 4D, a photoresist is coated on the silicon nitride film 4 to form a photoresist film (not shown). Then, grooves corresponding to an STI (Shallow Trench Isolation) formation pattern are formed in the photoresist film by use of the photolithography technique and part of the photoresist film corresponding to an active area formation pattern is left behind. Next, the silicon nitride film 4 is patterned with the photoresist film used as a mask to form the silicon nitride film 4 into a pattern corresponding to the active area formation pattern. In this case, the minimum processing size of the memory cell transistor is set to L1. In this example, the width (which is equivalent to the width of the floating gate in the gate width direction) of the silicon nitride film 4 in the gate width direction (in this example, in the word line direction) is set to the minimum processing size L1. Then, after the photoresist film is separated and removed, the conductive polysilicon film 3, gate insulating film 2 and substrate 1 are etched with the silicon nitride film 4 used as a mask to form shallow trenches in the substrate 1. Next, an insulating material, for example, silicon dioxide is deposited to form a silicon dioxide film above the substrate 1 in which the shallow trenches are formed. After this, the silicon dioxide film is subjected to a CMP (Chemical Mechanical Polishing) process with the silicon nitride film 4 used as a stopper to embed silicon dioxide into the shallow trenches. Thus, STI structures can be attained.

Next, as shown in FIGS. 5A to 5D, the silicon nitride film 4 is removed and the STI structures are etched back with the conductive polysilicon film used as a mask to expose the side walls of the conductive polysilicon films 3.

Then, as shown in FIGS. 6A to 6D, an inter-gate insulating film 5 is formed on the structure shown in FIGS. 5A to 5D. One example of the inter-gate insulating film 5 is a laminated film of silicon dioxide/silicon nitride/silicon dioxide which is a so-called ONO film. Next, openings 7 are formed in the inter-gate insulating film 5. The openings 7 are holes via which the conductive polysilicon films 3 are connected to conductive films formed above the conductive polysilicon films 3 in the block selection transistors and peripheral transistors. After this, a conductive material such as conductive polysilicon is deposited on the inter-gate insulating film 5 in which the openings 7 are formed to form a conductive polysilicon film 6. The thickness of the conductive polysilicon film 6 in this example, for example, the thickness thereof above the active area is H1. In this example, the thickness H1 is set equal to or smaller than 1.5 times the minimum processing size L1 (H$1 \leq 1.5$L$1$). As will be described later, the above setting is made to make gate processing easy. That is, an increase in the aspect ratio of the stacked gate structure is suppressed by setting the thickness H1 of the conductive polysilicon film 6 which lies above the active area equal to or smaller than 1.5 times the minimum processing size L1. Then, a cap film is formed on the conductive polysilicon film 6. For example, the cap film is used as a mask in the etching process when the stacked gate structure is processed and is used as a stopper in the etching process when an insulating material is embedded in between the stacked gate structures. Therefore, as the above material, a material having a selective etching ratio with respect to at least one of the conductive material contained in the stacked gate structure and the insulating material embedded in between the stacked gate structures is selected. Further, in order to prevent the STI structure from being inadvertently set back between the stacked gate structures, it is preferable to select a material having a selective etching ratio with respect to an insulating material contained in the STI structure. One example of the material is silicon nitride. In this example, silicon nitride is deposited on the conductive polysilicon film 6 to form a silicon nitride film 8 as a cap film, for example.

The step shown in FIGS. 6A to 6D can be modified into the steps shown in FIGS. 30A to 30E.

Figure 30A:
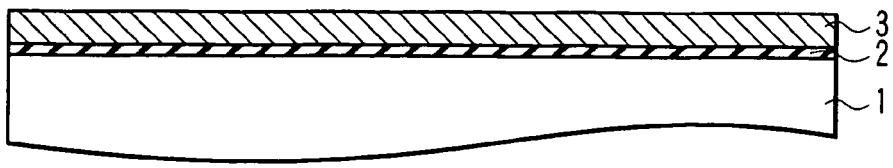
FIGS. 30A to 30E are cross sectional views showing a modification of this invention.
Figure 30B:
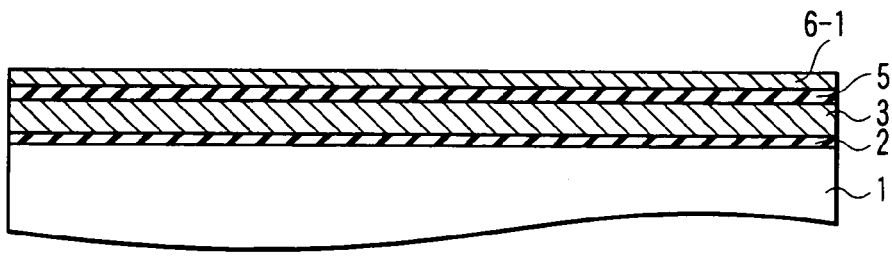
Figure 30C:
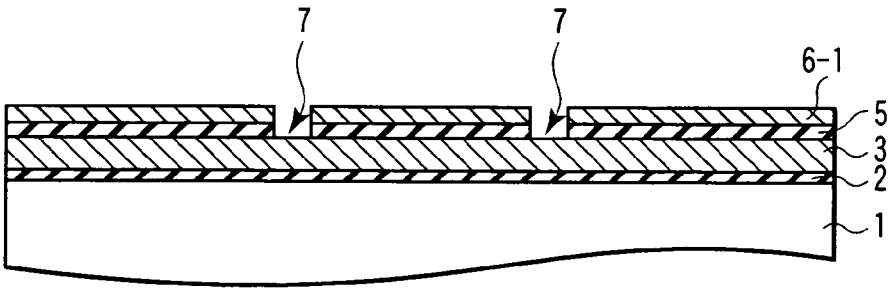
Figure 30D:
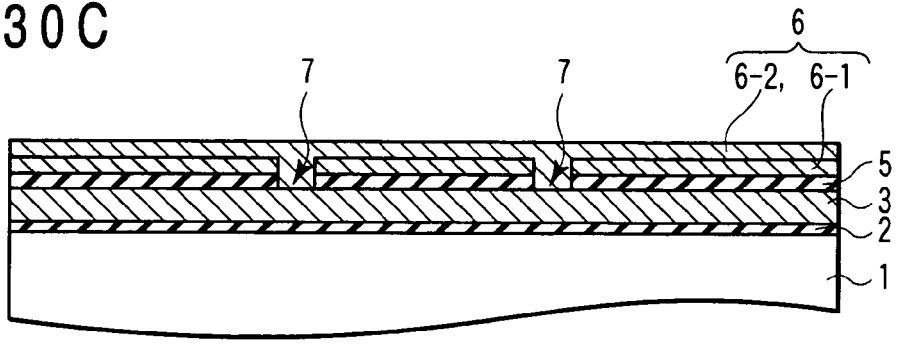

FIG. 30A shows the same cross section as that of FIG. 2B. First, an inter-gate insulating film 5 is formed on the structure shown in FIG. 30A and a first thin conductive film, for example, first thin conductive polysilicon film 6-1 is formed on the inter-gate insulating film 5 (FIG. 30B). Then, openings 7 are formed in the first thin conductive polysilicon film 6-1 and inter-gate insulating film 5 (FIG. 30C). Further, a second thin conductive film, for example, second thin conductive polysilicon film 6-2 is formed on the structure shown in FIG. 30C (FIG. 30D). Thus, a conductive polysilicon film 6 is formed of a laminated film of the thin films 6-1, 6-2. Then, a cap film, for example, a silicon nitride film 8 is formed on the conductive polysilicon film 6.

According to the above modification, the thin conductive polysilicon film 6-1 is formed on the inter-gate insulating film 5 and the openings 7 are formed in the inter-gate insulating film 5 in this state. Therefore, for example, a photoresist film is not directly formed on the inter-gate insulating film 5 and an advantage that the film quality of the inter-gate insulating film 5 can be suppressed from being deteriorated can be attained. The modification is applied not only to the first embodiment but also to the second and third embodiments described later.

Figure 30E:
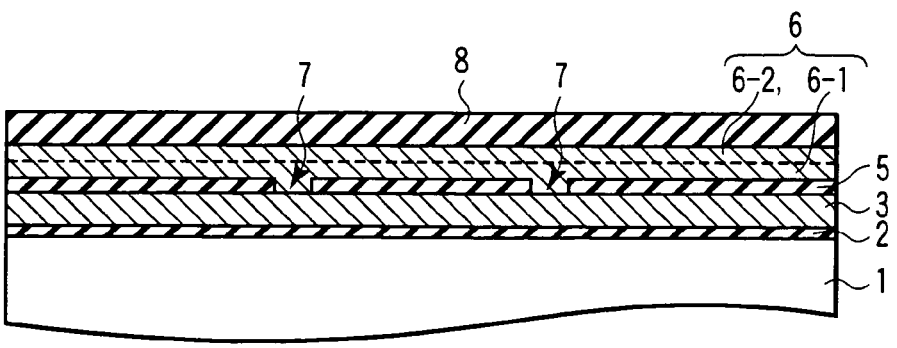

Also, in the modification, it is preferable to set the thickness H1 of the conductive polysilicon film 6 shown in FIG. 30E which lies above the active area equal to or smaller than 1.5 times the minimum processing size L1 as shown in FIGS. 6A to 6D, for example. This is because it is possible to suppress an increase in the aspect ratio of the stacked gate structure.

Next, as shown in FIGS. 7A to 7D, photoresist is coated on the silicon nitride film 8 to form a photoresist film (not shown). Then, the photoresist film is patterned by use of the photolithography technique to leave the photoresist in a pattern corresponding to a word line formation pattern, block selection line formation pattern and gate formation pattern of peripheral transistors. After this, the silicon nitride film 8, conductive polysilicon film 6, inter-gate insulating film 5 and conductive polysilicon film 3 are subjected to an RIE (Reactive Ion Etching) process with the photoresist film used as a mask to form first stacked gate structures. Then, the photoresist film is removed.

In this example, the width of the silicon nitride film 8 (which is equivalent to the width of the control gate in the gate length direction and the width of the floating gate in the gate length direction) in the gate length direction (which is the bit line direction in this example) is set to the minimum processing size L1.

Next, as shown in FIGS. 8A to 8D, an impurity of an opposite conductivity type, in this example, N type, for example, phosphorus or arsenic is ion-implanted into the substrate 1 with the first stacked gate structures and STI structures used as a mask to form N-type diffusion layers 9. Then, an insulating material, for example, silicon dioxide is deposited to form a silicon dioxide film 10 on the structure obtained after the N-type diffusion layers 9 are formed. After this, the silicon dioxide film 10 is subjected to the RIE process to leave the silicon dioxide films 10 on the side walls of the first stacked gate structures. In this example, the silicon dioxide films 10 are filled into between the structure used as the gate of the block selection transistor and the structure used as the gate of the memory cell transistor and between the structures used as the gates of the memory cell transistors. Next, an impurity of an opposite conductivity type, in this example, N type, for example, phosphorus or arsenic is ion-implanted into the substrate 1 to form N-type diffusion layers 11 with the first stacked gate structures, silicon dioxide films 10 and STI structures used as a mask. Then, an insulating material, for example, silicon dioxide is deposited to form a silicon dioxide film 12 on the structure obtained after the N-type diffusion layers 11 are formed. As the insulating material, it is preferable to use a material having a selective etching ratio with respect to the STI structure. This is because the insulating material can be used as a stopper in the etching process when openings for bit line contacts or the like which reach the substrate 1 are formed. Further, in this example, it is preferable to use a material having a selective etching ratio with respect to a first-layered inter-level insulating film to be next formed. This is because the insulating material can be used as a stopper in the etching process when grooves in which conductive materials configuring word lines, block selection lines and gates of peripheral transistors are embedded are formed. One example of the material which satisfies the above two requirements is silicon nitride. Then, an insulating material, for example, silicon dioxide is deposited to form a first-layered inter-level insulating film 13 on the silicon nitride film 12.

Next, as shown in FIGS. 9A to 9D, a photoresist is coated on the first-layered inter-level insulating film 13 to form a photoresist film (not shown). Then, the photoresist film is patterned by use of the photolithography technique to form a groove pattern in which conductive materials configuring word lines, block selection lines and gates of the peripheral transistors are embedded in the photoresist film. After this, the first-layered inter-level insulating film 13 is etched, for example, subjected to the RIE process with the photoresist film used as a mask. The etching condition is set so that the first-layered inter-level insulating film 13 can be easily etched and the silicon nitride film 12 will be difficult to be etched. In this example, the condition is set so that silicon dioxide is easily etched and silicon nitride is difficult to be etched. As a result, the etching process can be stopped in a portion of the silicon nitride film 12.

Further, the etching process is continuously performed to remove the silicon nitride films 12 and 8 (refer to FIGS. 10A to 10D). Thus, wiring grooves 14 are formed (refer to FIGS. 9A to 9D). The etching condition is set so that the silicon nitride films 12 and 8 can be easily etched and the first-layered inter-level insulating film 13 and silicon dioxide film 10 will be difficult to be etched. In this example, the condition is set so that silicon nitride is easily etched and silicon dioxide is difficult to be etched. As a result, for example, the wiring grooves 14 can be suppressed from being inadvertently enlarged in a portion of the first-layered inter-level insulating film 13. Further, when the wiring grooves 14 overlap a portion of the silicon dioxide film 10, for example, a hole which reaches the floating gate can be suppressed from being formed (suppression of the short circuit between the word line and the floating gate).

The technical idea shown in FIGS. 31A to 31C can be applied to the steps of FIGS. 9A to 9D and FIGS. 10A to 10D.

Figure 9A:
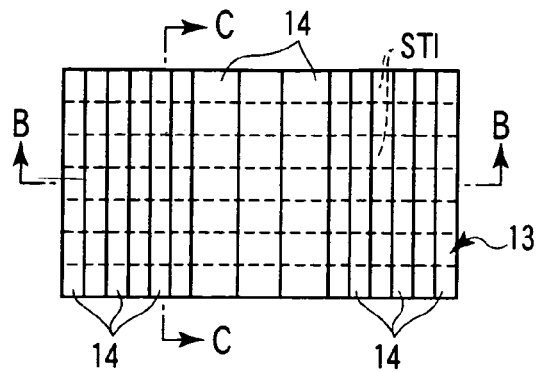
FIG. 9A is a plan view of the memory cell array of the semiconductor integrated circuit device according to the first embodiment of this invention.
Figure 9B:
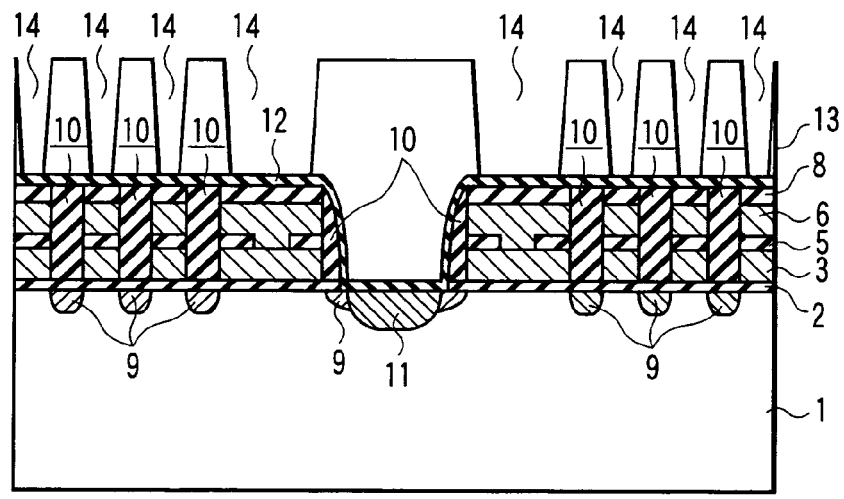
FIG. 9B is a cross sectional view taken along the B-B line of FIG. 9A.
Figure 9C:
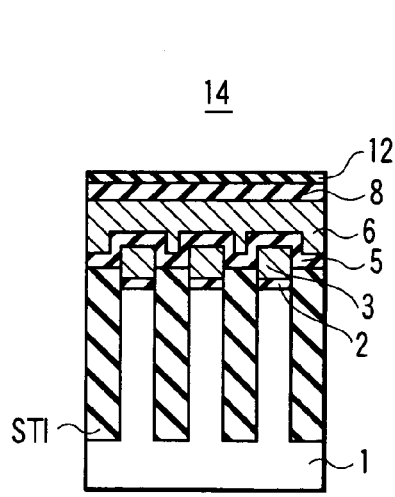
FIG. 9C is a cross sectional view taken along the C-C line of FIG. 9A.
Figure 9D:
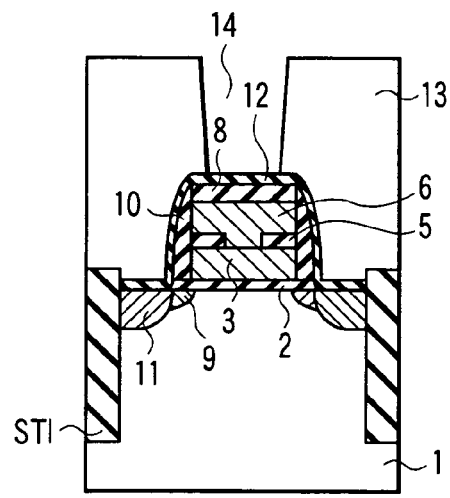
FIG. 9D is a cross sectional view showing the peripheral transistor.
Figure 10:
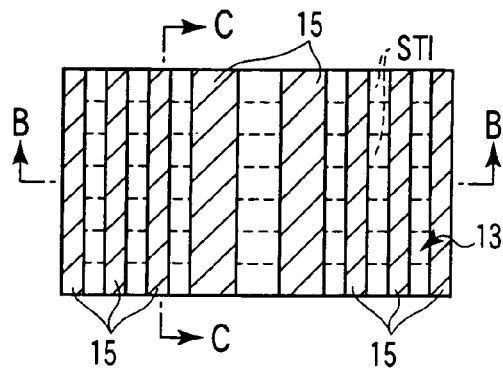
FIG. 10A is a plan view of the memory cell array of the semiconductor integrated circuit device according to the first embodiment of this invention.
FIG. 10B is a cross sectional view taken along the B-B line of FIG. 10A.
FIG. 10C is a cross sectional view taken along the C-C line of FIG. 10A.
FIG. 10D is a cross sectional view showing the peripheral transistor.
Figure 10:
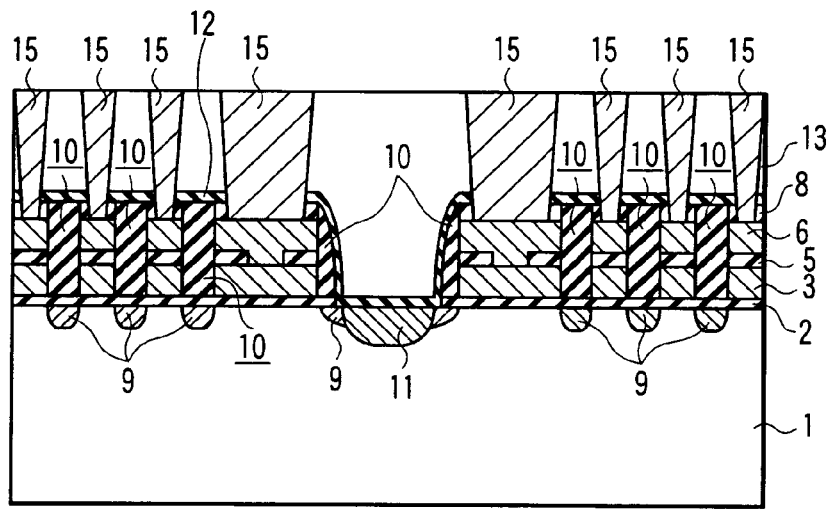
Figure 10:
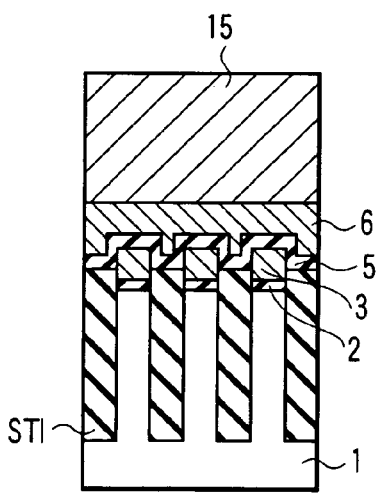
Figure 10:
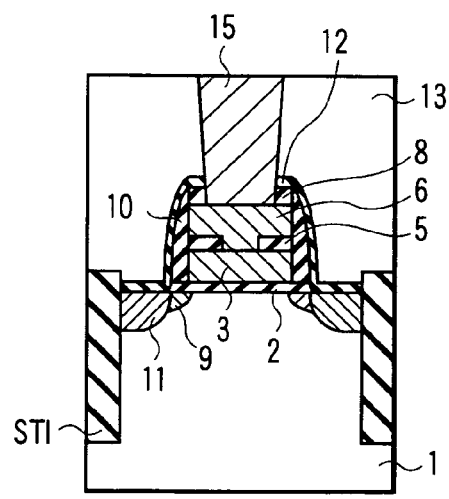
Figure 11A:
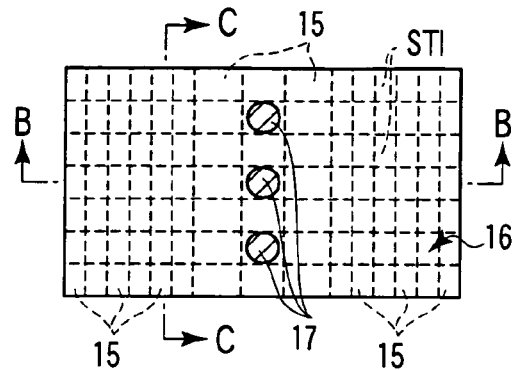
FIG. 11A is a plan view of the memory cell array of the semiconductor integrated circuit device according to the first embodiment of this invention.
Figure 11B:
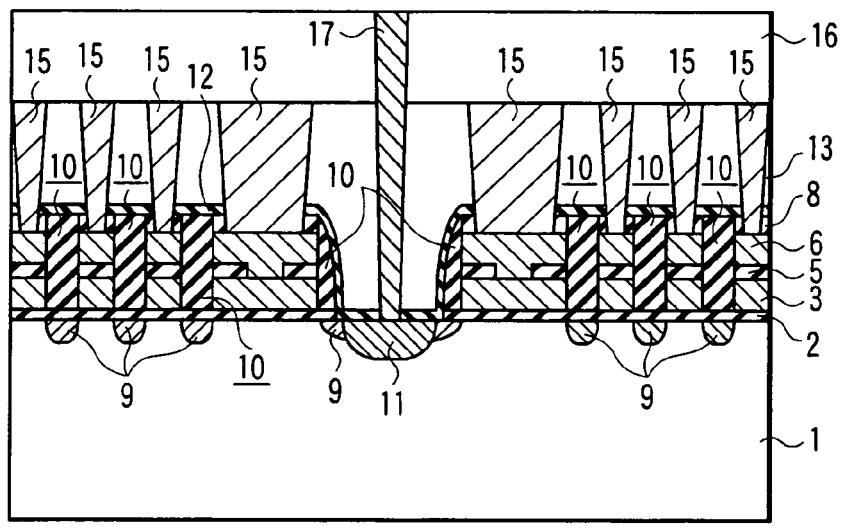
FIG. 11B is a cross sectional view taken along the B-B line of FIG. 11A.
Figure 11C:
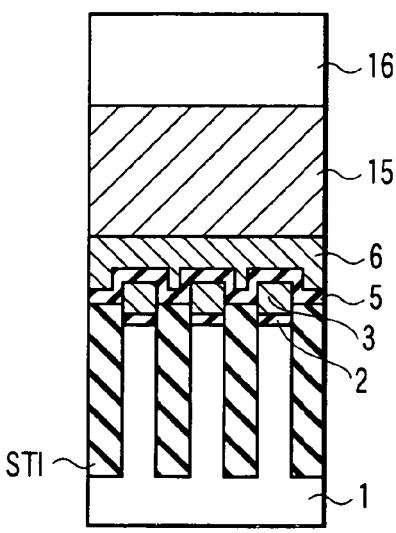
FIG. 11C is a cross sectional view taken along the C-C line of FIG. 11A.
Figure 11D:
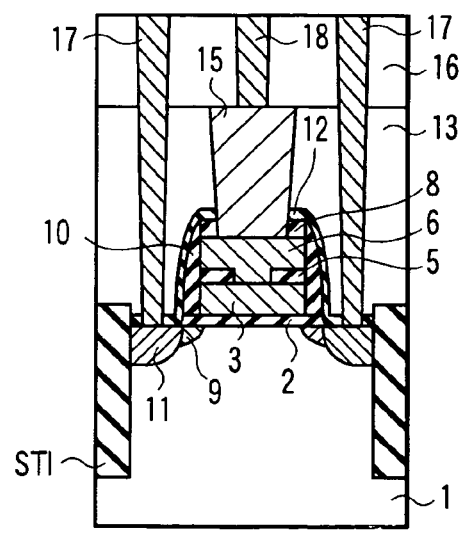
FIG. 11D is a cross sectional view showing the peripheral transistor.
Figure 12A:
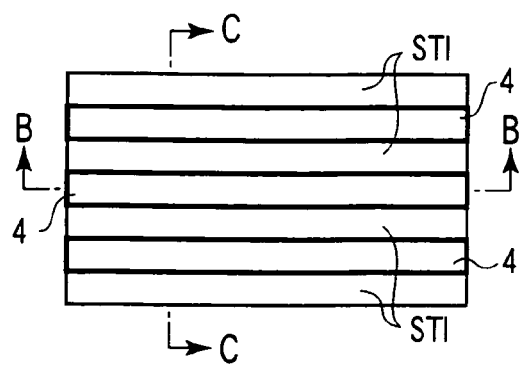
FIG. 12A is a plan view of a memory cell array of a semiconductor integrated circuit device according to a second embodiment of this invention.
Figure 12B:
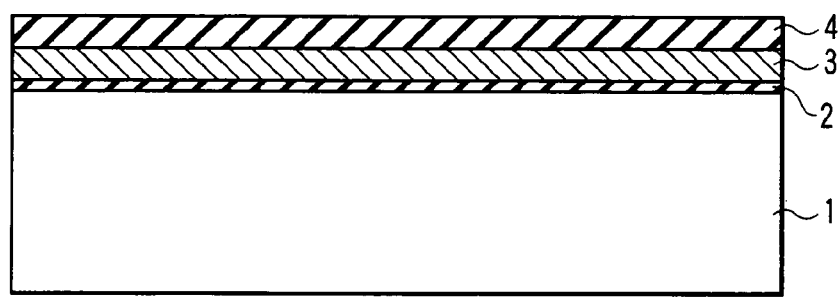
FIG. 12B is a cross sectional view taken along the B-B line of FIG. 12A.
Figures 12C, 12D:
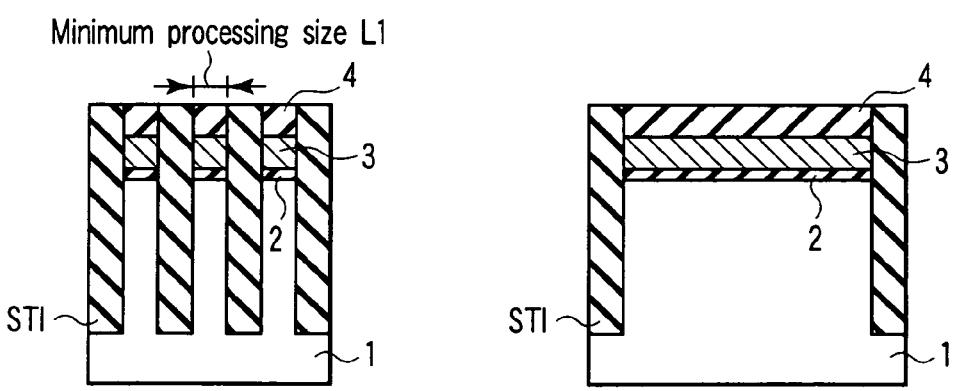
FIG. 12C is a cross sectional view taken along the C-C line of FIG. 12A.
FIG. 12D is a cross sectional view showing a peripheral transistor.
Figure 13A:
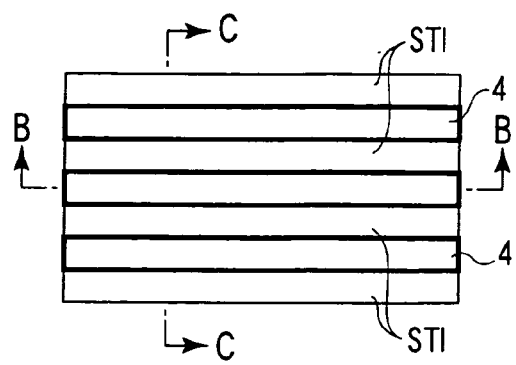
FIG. 13A is a plan view of the memory cell array of the semiconductor integrated circuit device according to the second embodiment of this invention.
Figure 13B:
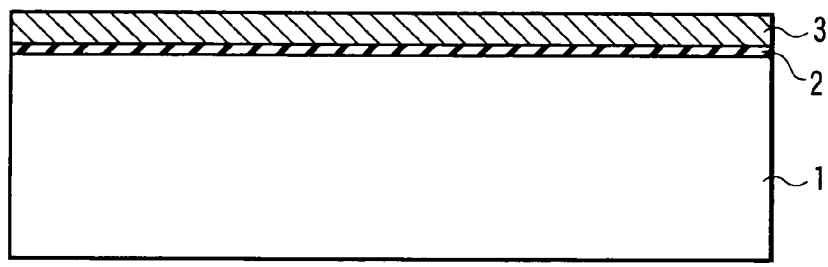
FIG. 13B is a cross sectional view taken along the B-B line of FIG. 13A.
Figures 13C, 13D:
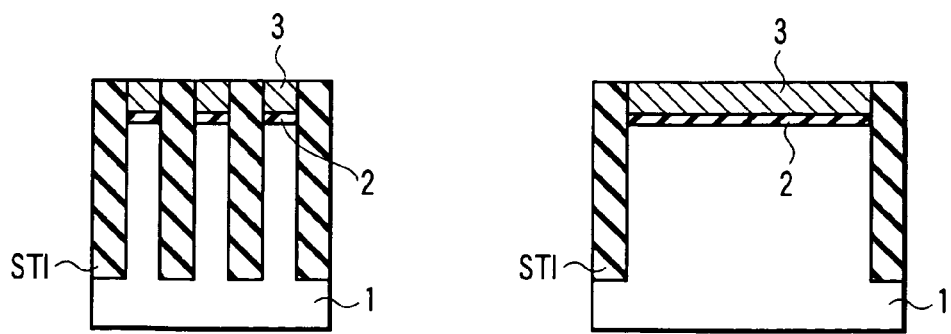
FIG. 13C is a cross sectional view taken along the C-C line of FIG. 13A.
FIG. 13D is a cross sectional view showing the peripheral transistor.
Figure 14A:
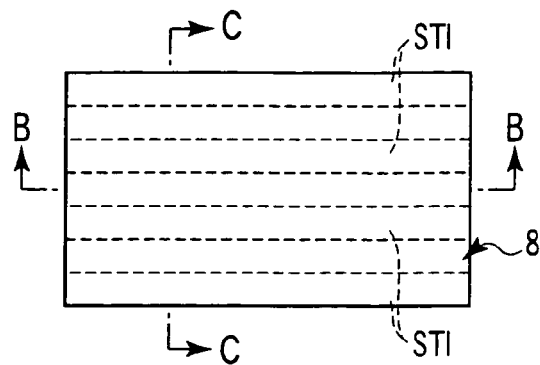
FIG. 14A is a plan view of the memory cell array of the semiconductor integrated circuit device according to the second embodiment of this invention.
Figure 14B:
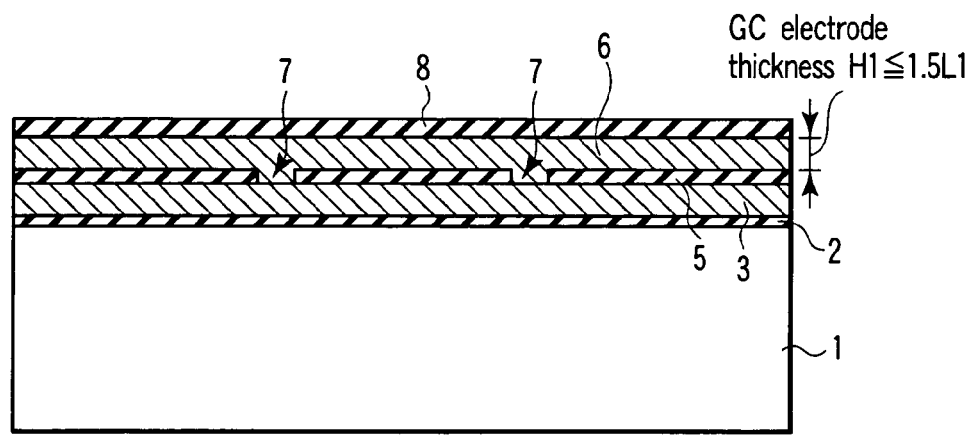
FIG. 14B is a cross sectional view taken along the B-B line of FIG. 14A.
Figures 14C, 14D:
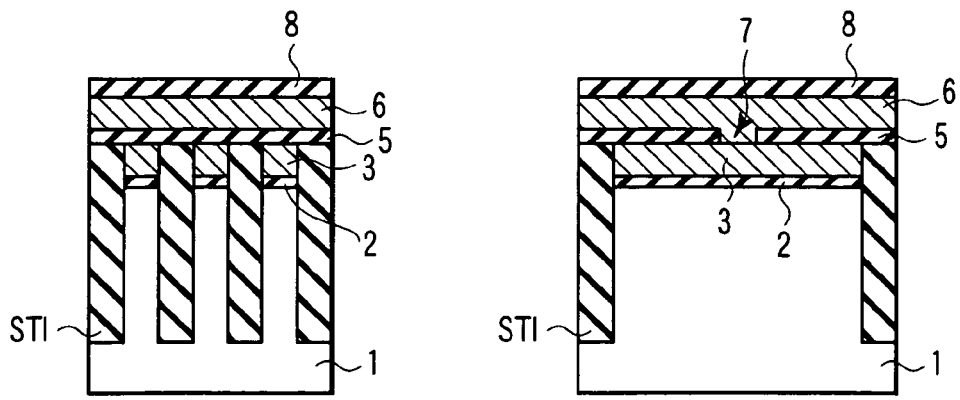
FIG. 14C is a cross sectional view taken along the C-C line of FIG. 14A.
FIG. 14D is a cross sectional view showing the peripheral transistor.
Figure 15A:
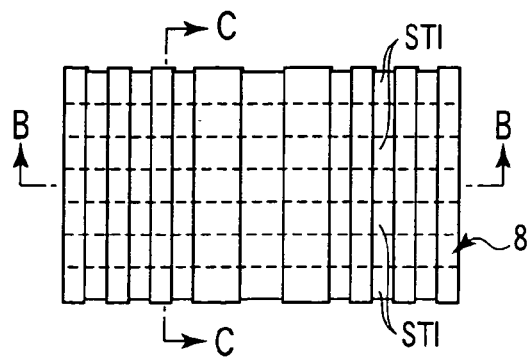
FIG. 15A is a plan view of the memory cell array of the semiconductor integrated circuit device according to the second embodiment of this invention.
Figure 15B:
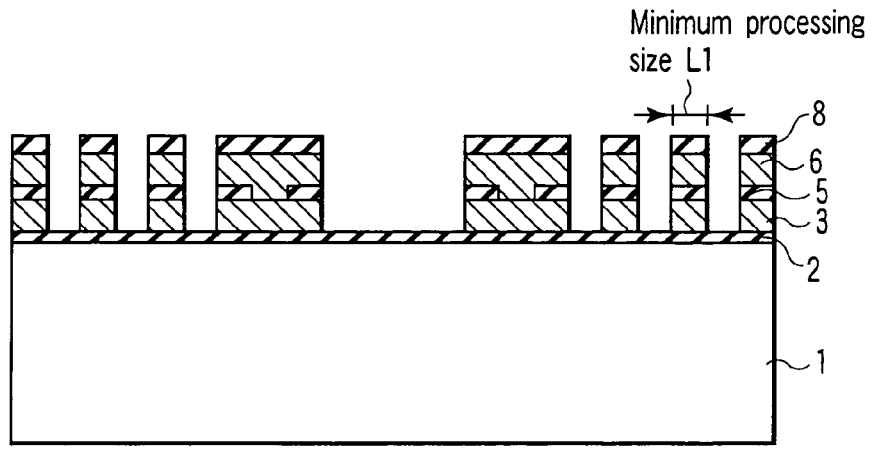
FIG. 15B is a cross sectional view taken along the B-B line of FIG. 15A.
Figure 15C:
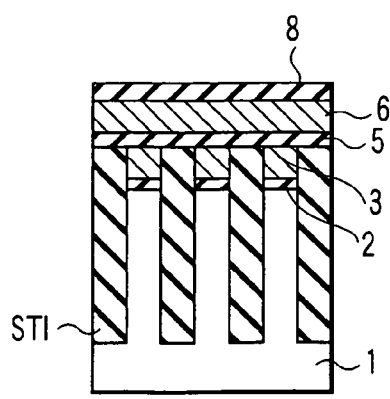
FIG. 15C is a cross sectional view taken along the C-C line of FIG. 15A.
Figure 15D:
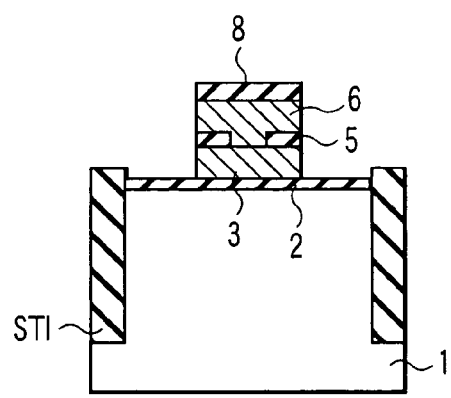
FIG. 15D is a cross sectional view showing the peripheral transistor.
Figure 16A:
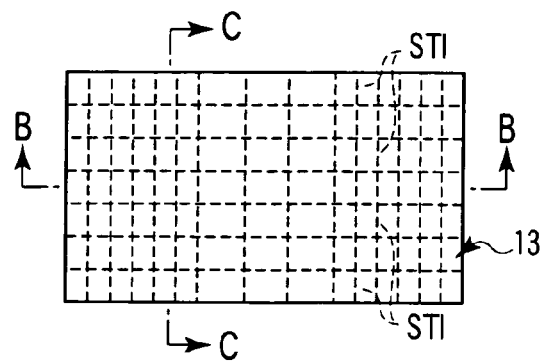
FIG. 16A is a plan view of the memory cell array of the semiconductor integrated circuit device according to the second embodiment of this invention.
Figure 16B:
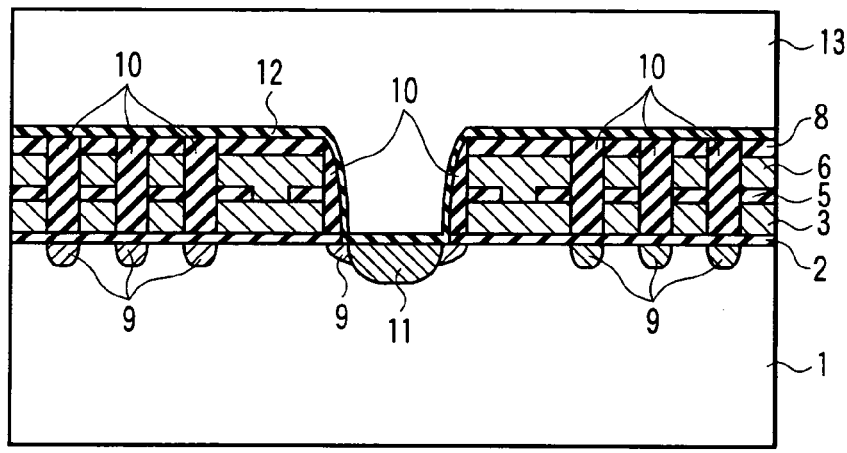
FIG. 16B is a cross sectional view taken along the B-B line of FIG. 16A.
Figure 16C:
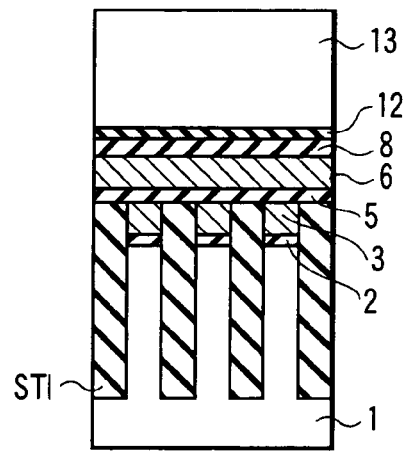
FIG. 16C is a cross sectional view taken along the C-C line of FIG. 16A.
Figure 16D:
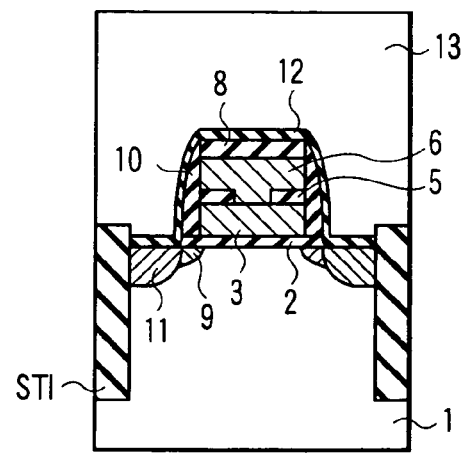
FIG. 16D is a cross sectional view showing the peripheral transistor.
Figure 17A:
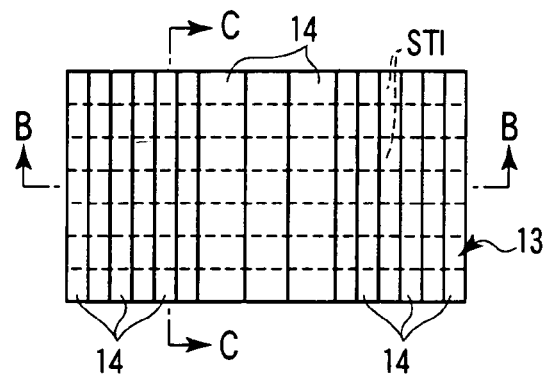
FIG. 17A is a plan view of the memory cell array of the semiconductor integrated circuit device according to the second embodiment of this invention.
Figure 17B:
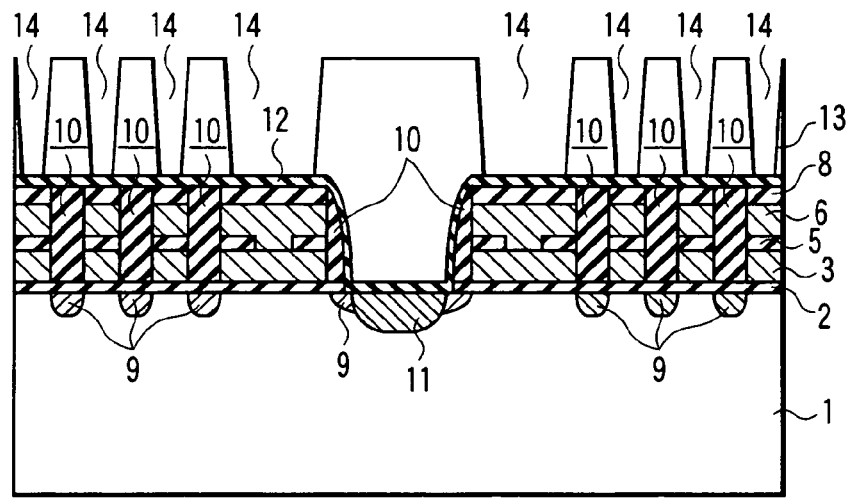
FIG. 17B is a cross sectional view taken along the B-B line of FIG. 17A.
Figure 17C:
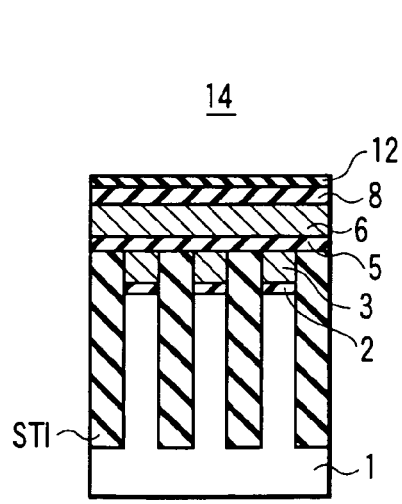
FIG. 17C is a cross sectional view taken along the C-C line of FIG. 17A.
Figure 17D:
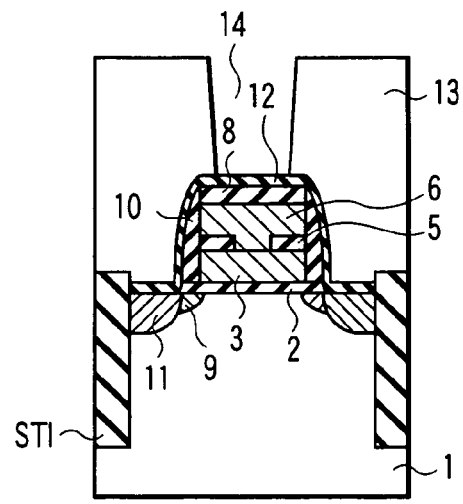
FIG. 17D is a cross sectional view showing the peripheral transistor.
Figure 18A:
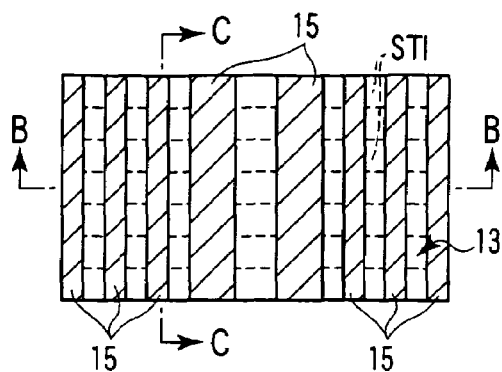
FIG. 18A is a plan view of the memory cell array of the semiconductor integrated circuit device according to the second embodiment of this invention.
Figure 18B:
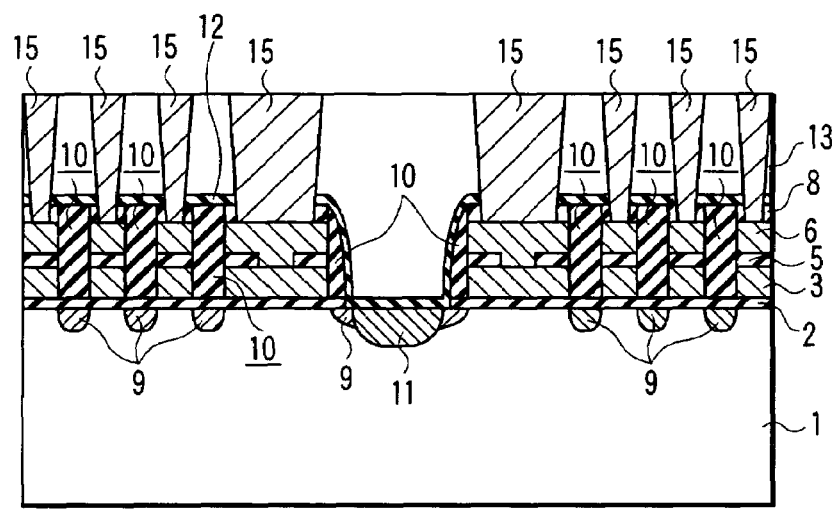
FIG. 18B is a cross sectional view taken along the B-B line of FIG. 18A.
Figure 18C:
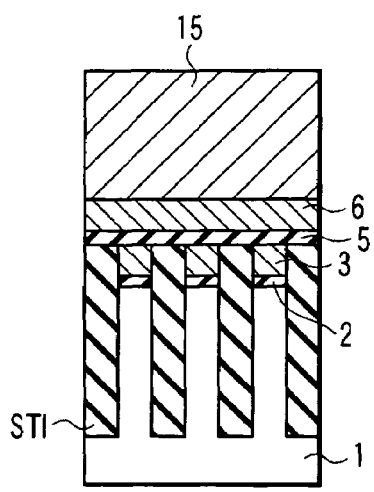
FIG. 18C is a cross sectional view taken along the C-C line of FIG. 18A.
Figure 18D:
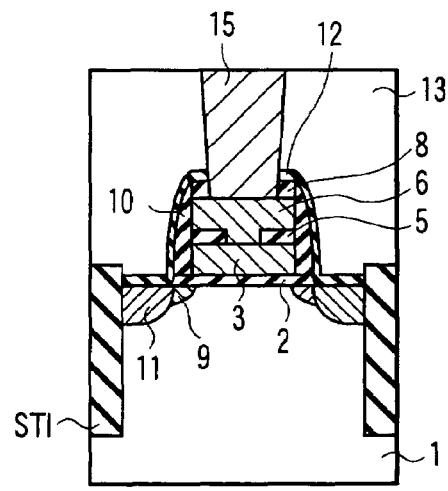
FIG. 18D is a cross sectional view showing the peripheral transistor.
Figure 19A:
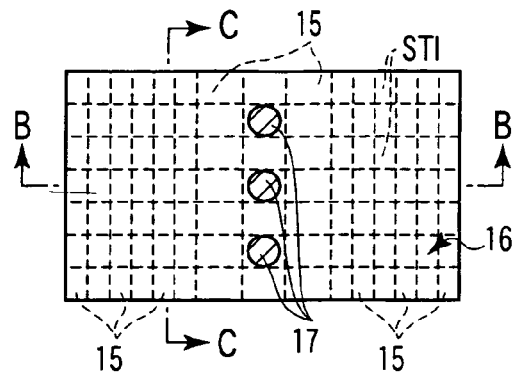
FIG. 19A is a plan view of the memory cell array of the semiconductor integrated circuit device according to the second embodiment of this invention.
Figure 19B:
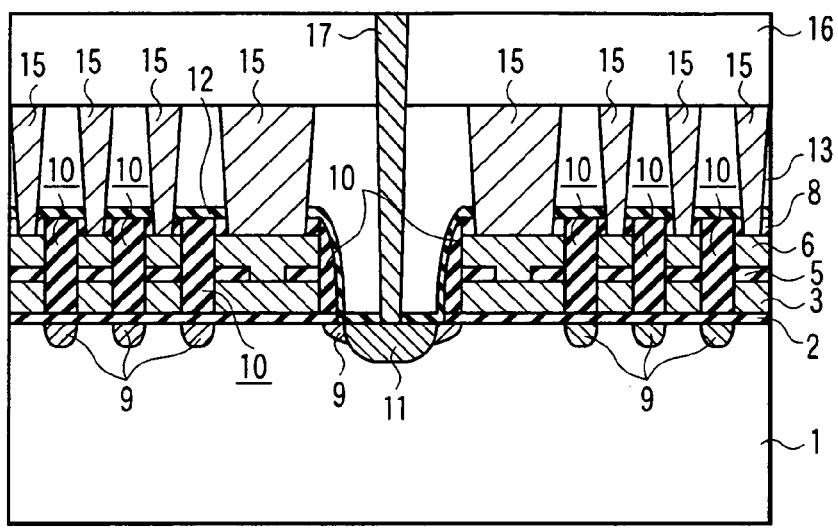
FIG. 19B is a cross sectional view taken along the B-B line of FIG. 19A.
Figure 19C:
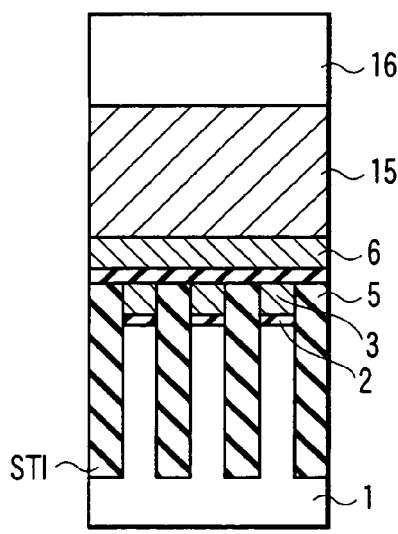
FIG. 19C is a cross sectional view taken along the C-C line of FIG. 19A.
Figure 19D:
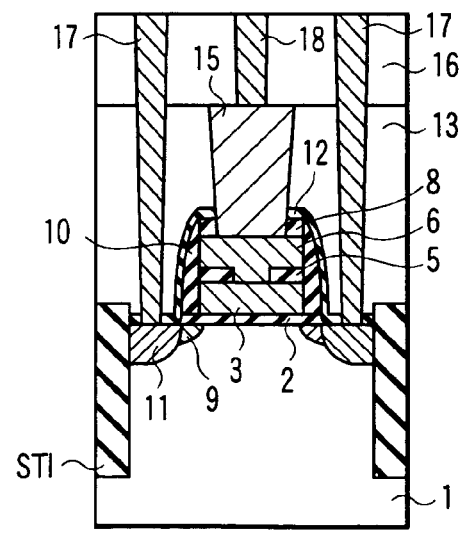
FIG. 19D is a cross sectional view showing the peripheral transistor.
Figure 21A:
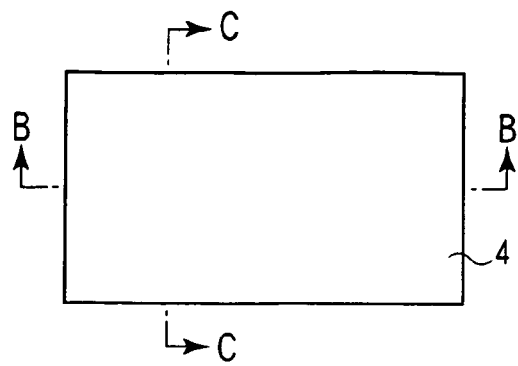
FIG. 21A is a plan view of the memory cell array of the semiconductor integrated circuit device according to the third embodiment of this invention.
Figure 21B:
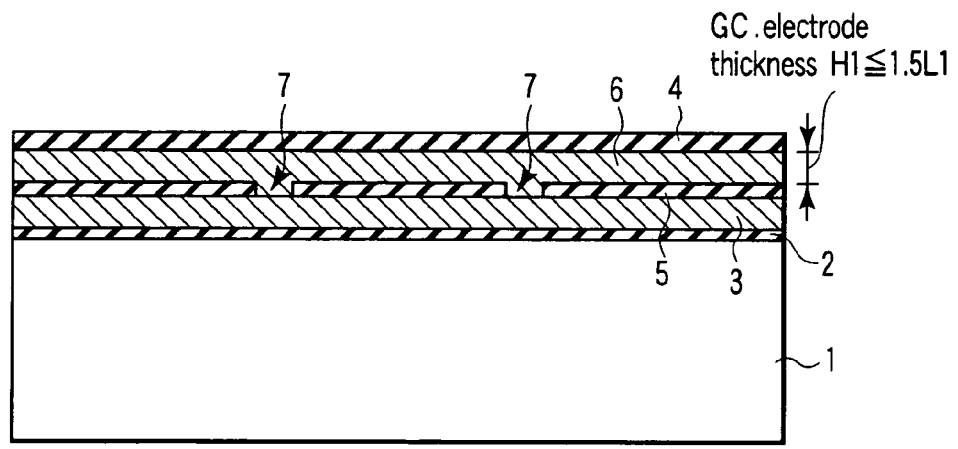
FIG. 21B is a cross sectional view taken along the B-B line of FIG. 21A.
Figure 21C:
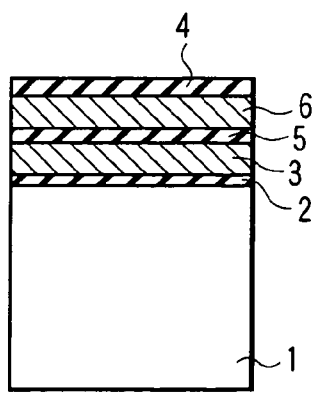
FIG. 21C is a cross sectional view taken along the C-C line of FIG. 21A.
Figure 21D:
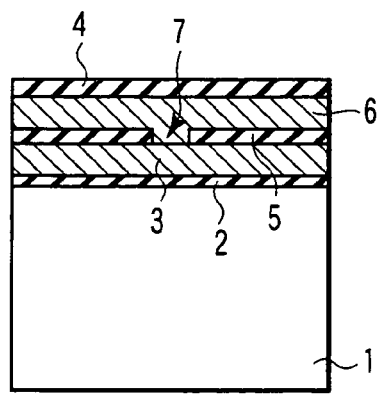
FIG. 21D is a cross sectional view showing the peripheral transistor.
Figure 22A:
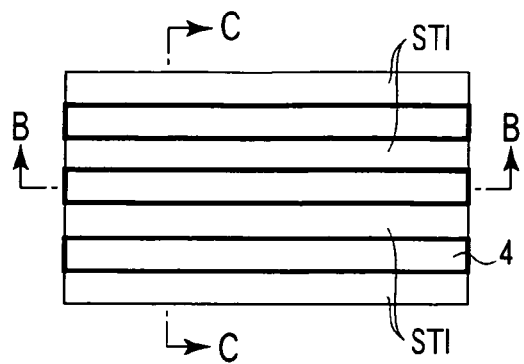
FIG. 22A is a plan view of the memory cell array of the semiconductor integrated circuit device according to the third embodiment of this invention.
Figure 22B:
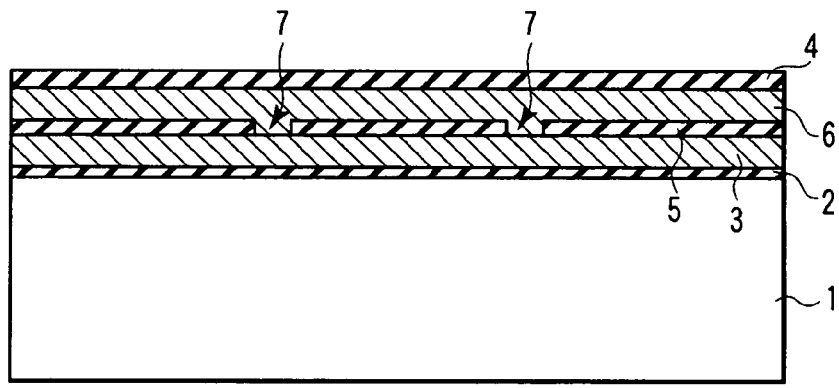
FIG. 22B is a cross sectional view taken along the B-B line of FIG. 22A.
Figure 22C:
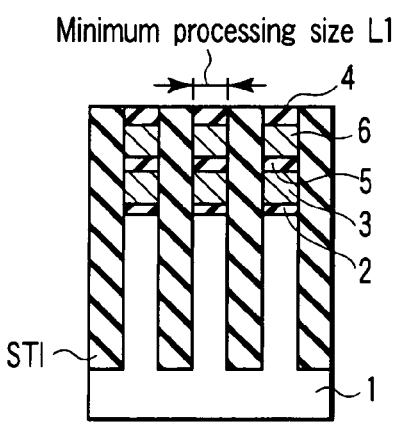
FIG. 22C is a cross sectional view taken along the C-C line of FIG. 22A.
Figure 22D:
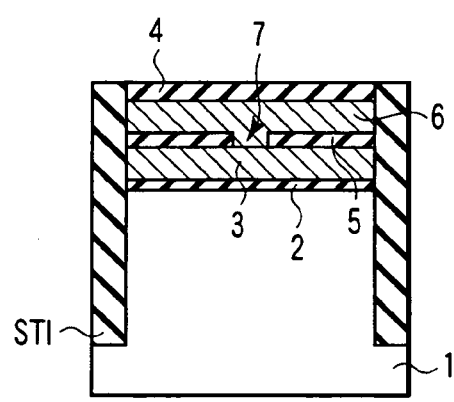
FIG. 22D is a cross sectional view showing the peripheral transistor.
Figure 23A:
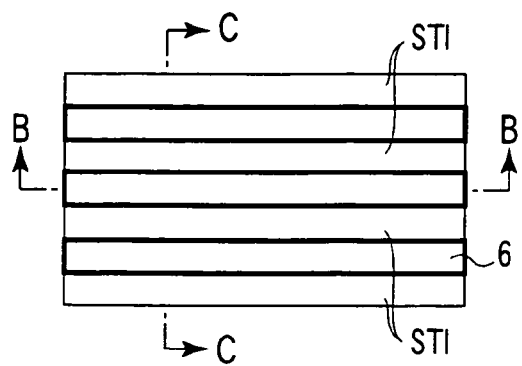
FIG. 23A is a plan view of the memory cell array of the semiconductor integrated circuit device according to the third embodiment of this invention.
Figure 23B:
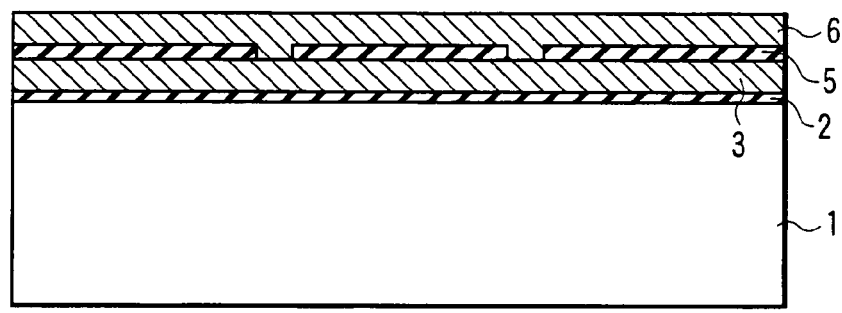
FIG. 23B is a cross sectional view taken along the B-B line of FIG. 23A.
Figures 23C, 23D:
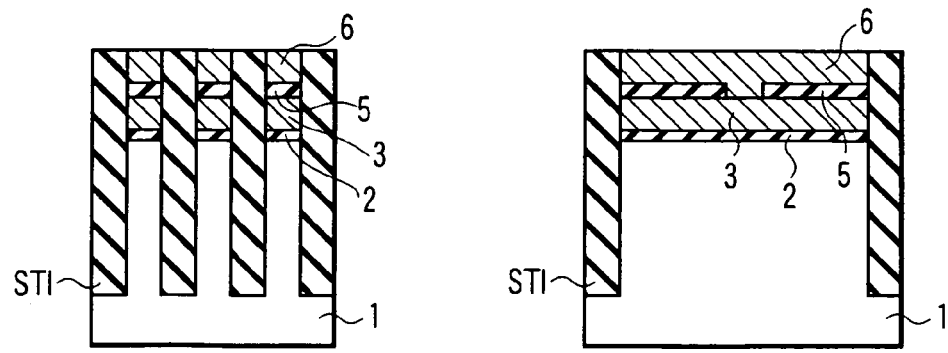
FIG. 23C is a cross sectional view taken along the C-C line of FIG. 23A.
FIG. 23D is a cross sectional view showing the peripheral transistor.
Figure 24A:
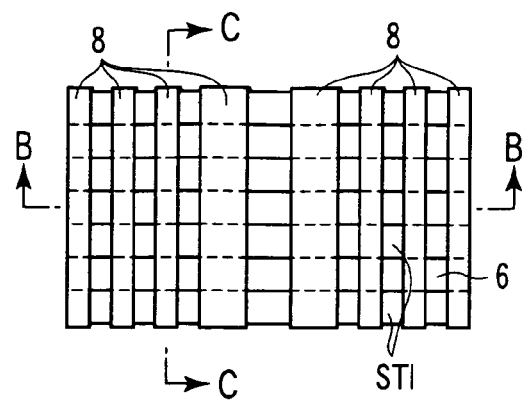
FIG. 24A is a plan view of the memory cell array of the semiconductor integrated circuit device according to the third embodiment of this invention.
Figure 24B:
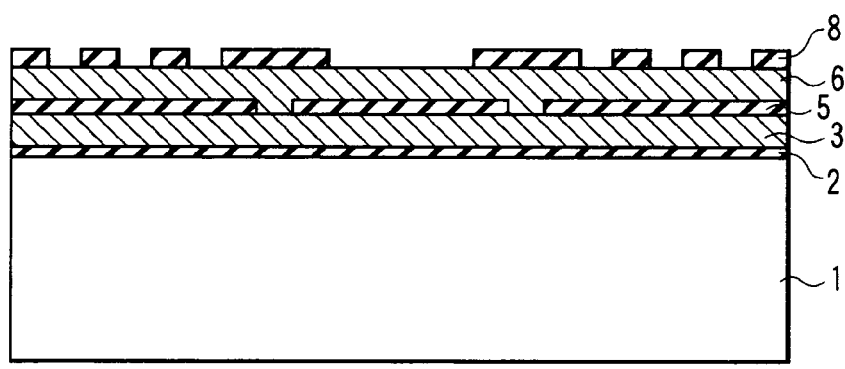
FIG. 24B is a cross sectional view taken along the B-B line of FIG. 24A.
Figure 24C:
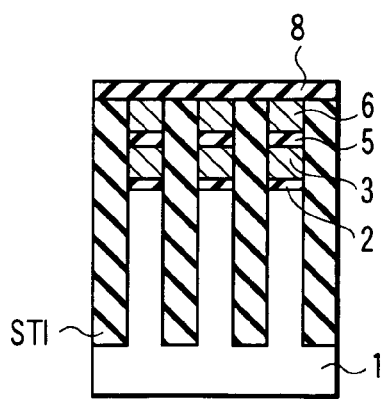
FIG. 24C is a cross sectional view taken along the C-C line of FIG. 24A.
Figure 24D:
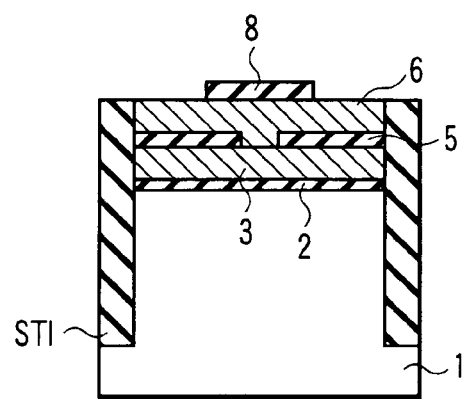
FIG. 24D is a cross sectional view showing the peripheral transistor.
Figure 25A:
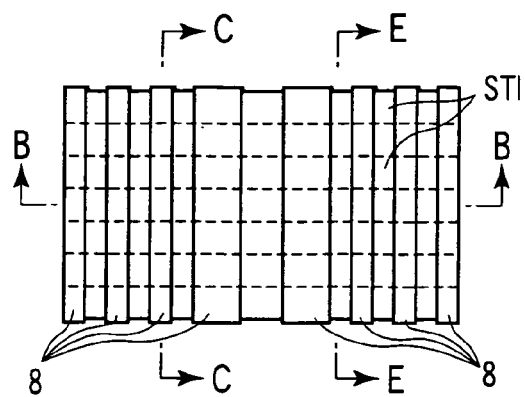
FIG. 25A is a plan view of the memory cell array of the semiconductor integrated circuit device according to the third embodiment of this invention.
Figure 25B:
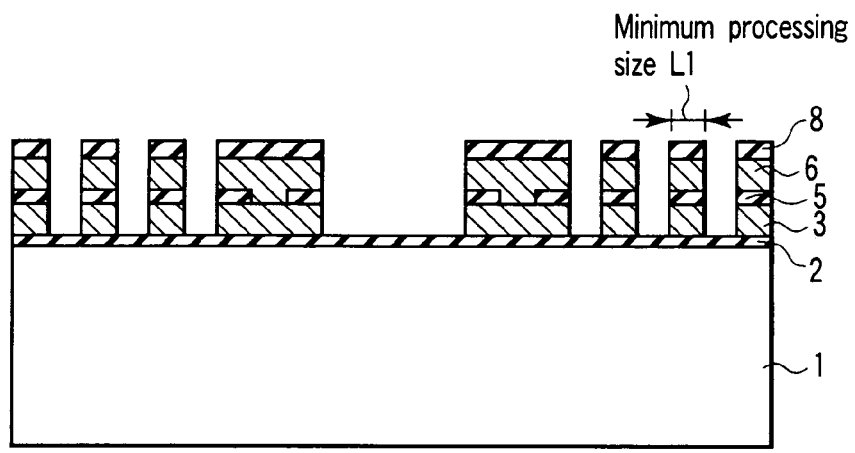
FIG. 25B is a cross sectional view taken along the B-B line of FIG. 25A.
Figure 25C:
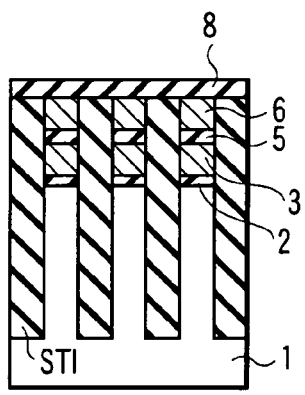
FIG. 25C is a cross sectional view taken along the C-C line of FIG. 25A.
Figure 25D:
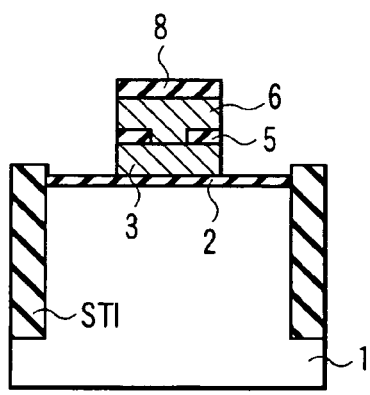
FIG. 25D is a cross sectional view showing the peripheral transistor.
Figure 25E:
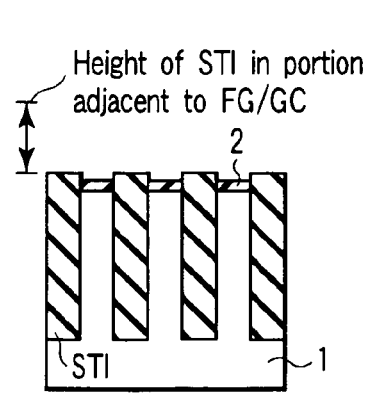
FIG. 25E is a cross sectional view taken along the E-E line of FIG. 25A.
Figure 26A:
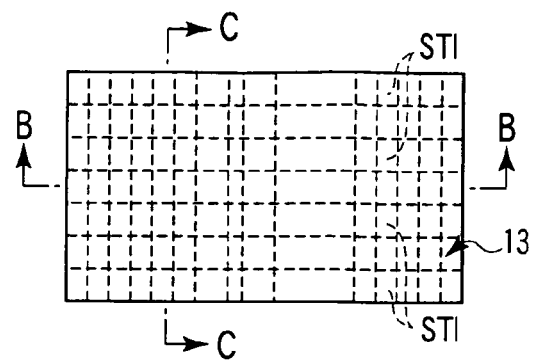
FIG. 26A is a plan view of the memory cell array of the semiconductor integrated circuit device according to the third embodiment of this invention.
Figure 26B:
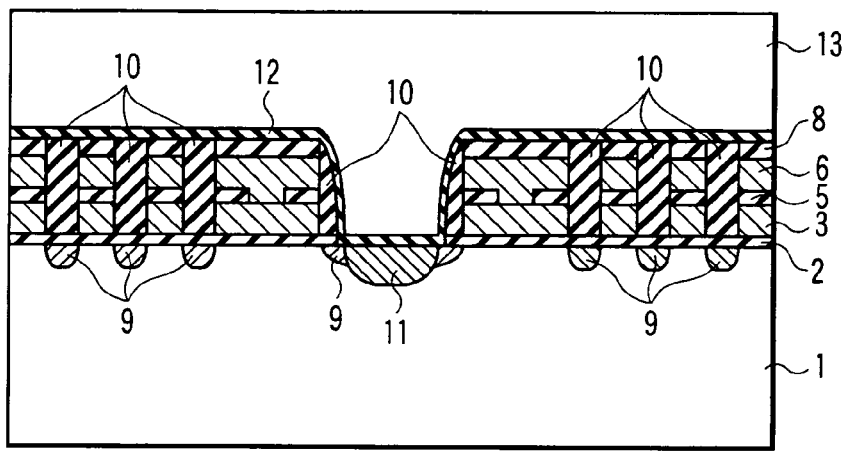
FIG. 26B is a cross sectional view taken along the B-B line of FIG. 26A.
Figure 26C:
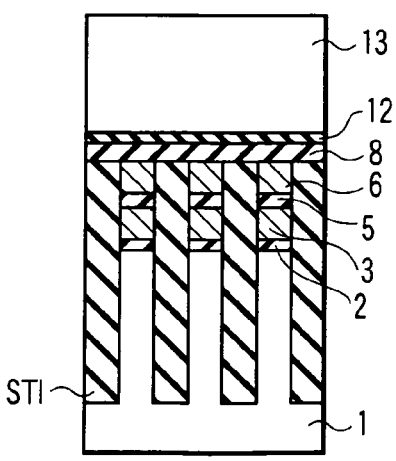
FIG. 26C is a cross sectional view taken along the C-C line of FIG. 26A.
Figure 26D:
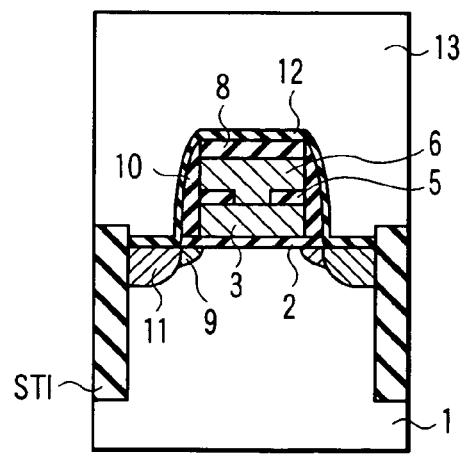
FIG. 26D is a cross sectional view showing the peripheral transistor.
Figure 27A:
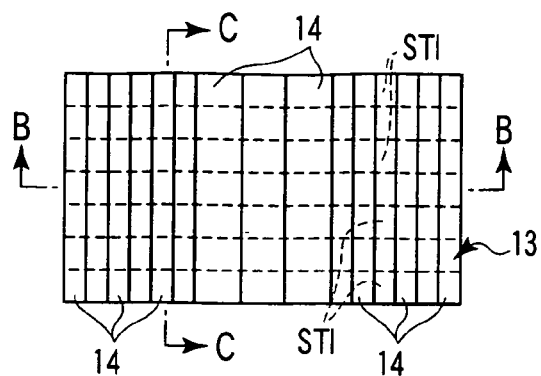
FIG. 27A is a plan view of the memory cell array of the semiconductor integrated circuit device according to the third embodiment of this invention.
Figure 27B:
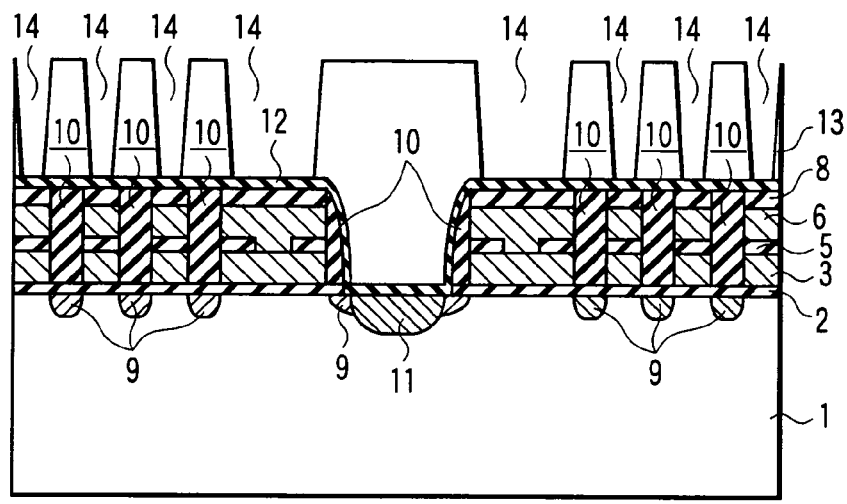
FIG. 27B is a cross sectional view taken along the B-B line of FIG. 27A.
Figure 27C:
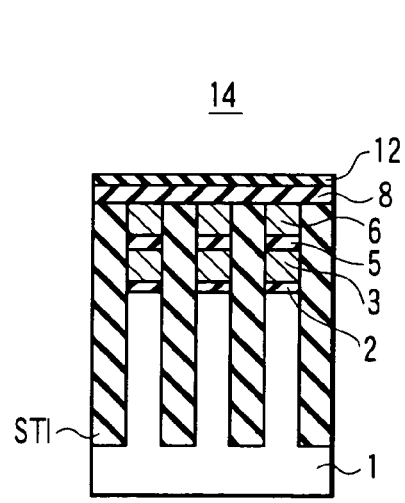
FIG. 27C is a cross sectional view taken along the C-C line of FIG. 27A.
Figure 27D:
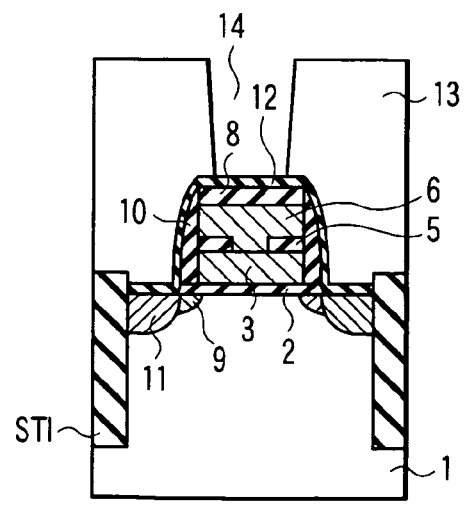
FIG. 27D is a cross sectional view showing the peripheral transistor.
Figure 28A:
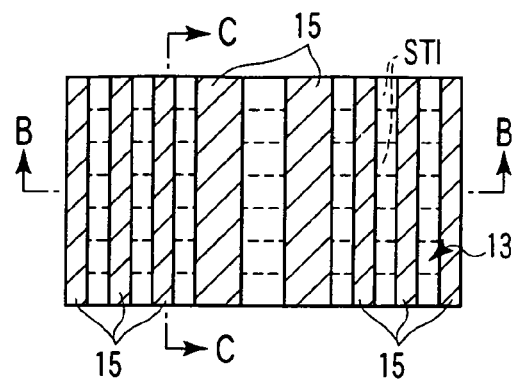
FIG. 28A is a plan view of the memory cell array of the semiconductor integrated circuit device according to the third embodiment of this invention.
Figure 28B:
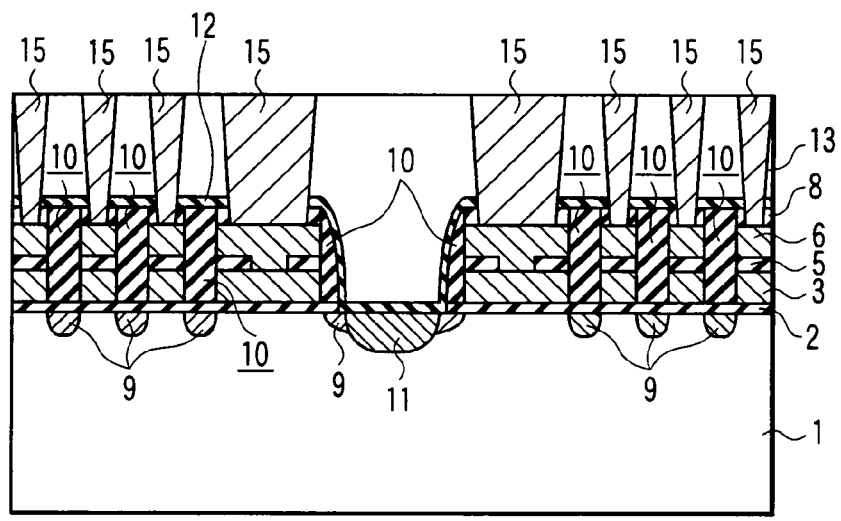
FIG. 28B is a cross sectional view taken along the B-B line of FIG. 28A.
Figure 28C:
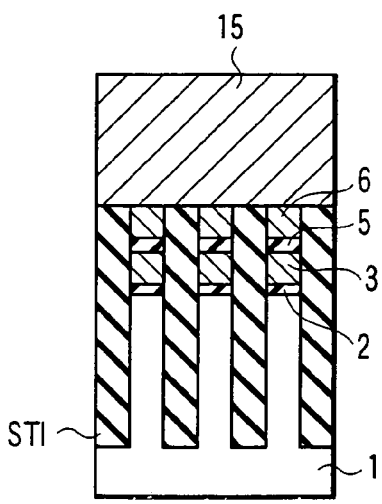
FIG. 28C is a cross sectional view taken along the C-C line of FIG. 28A.
Figure 28D:
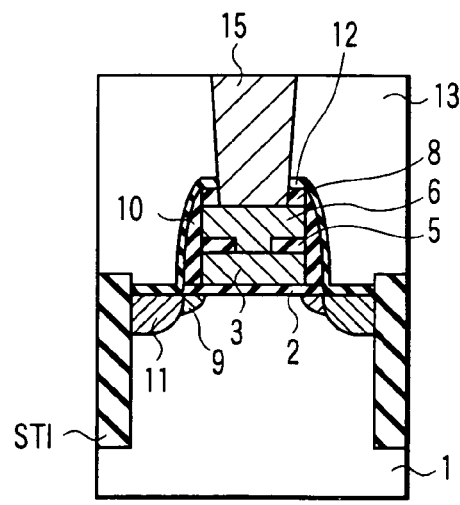
FIG. 28D is a cross sectional view showing the peripheral transistor.

FIG. 31A is a cross sectional view showing an enlarged portion of the first stacked gate structure shown in FIG. 9B. First, first wiring grooves 14-1 are formed in the first-layered inter-level insulating film 13 of the structure shown in FIG. 31A. At this time, the width (top width) Wtop of the first wiring groove 14-1 in the top portion thereof is made larger than the width (bottom width) Wbtm in the bottom portion thereof. That is, a taper which becomes narrower as the groove becomes deeper is made (FIG. 31B). For example, the taper can be controlled by adjusting the etching condition, for example, the flow ratio of carrier gas to reactive gas. After this, second wiring grooves 14-2 are formed in the silicon nitride films 12 and 8. Also, in this case, a taper which becomes narrower as the groove becomes deeper can be made (FIG. 31C). For example, the taper can be controlled by adjusting the flow ratio of carrier gas to reactive gas.

For example, according to the technical idea that the taper which becomes narrower as the groove becomes deeper is made with respect to the wiring groove 14, for example, the bottom of the wiring groove 14 can be prevented from being deviated from the upper surface of the conductive polysilicon film 6 in a case where misalignment of the photomask occurs as shown in FIG. 31D or 31E. The advantage attained at this time is that a variation in the contact area between the wiring groove 14 and the conductive polysilicon film 6 can be suppressed, and therefore, a variation in the resistances of the word line and block selection line can be made small. Further, since the bottom of the wiring groove 14 does not deviate from the upper surface of the conductive polysilicon film 6, the silicon dioxide film 10 is prevented from being inadvertently etched and the effect of preventing the short circuit between the word line and the floating gate can be further enhanced. The technical idea is applied not only to the first embodiment but also to the second and third embodiments described later.

After the wiring grooves 14 are formed, a conductive material, for example, tungsten is deposited to form a tungsten film 15 on the structure in which the wiring grooves 14 are formed as shown in FIGS. 10A to 10D. Then, the tungsten film 15 is subjected to the CMP process to embed the tungsten film 15 into the wiring grooves 14. In this case, the conductive material can also be formed by use of a selective epitaxial growth method using a conductive material exposed to the bottom surface of the wiring groove 14 as a seed crystal.

Next, as shown in FIGS. 11A to 11D, an insulating material, for example, silicon dioxide is deposited on the structure having the tungsten films 15 embedded into the wiring grooves 14 to form a second-layered inter-level insulating film 16. Then, holes which reach the tungsten films 15 are formed in the second-layered inter-level insulating film 16 and holes which reach the diffusion layers 11 are formed in the second-layered and first-layered inter-level insulating films 16 and 13. Next, a conductive material, for example, tungsten films 17, 18 are embedded into the above holes.

After this, a semiconductor integrated circuit device according to the first embodiment is completed by sequentially forming bit lines, upper-layered wirings and the like by use of a known manufacturing method although not particularly shown in the drawing.

Figure 32:
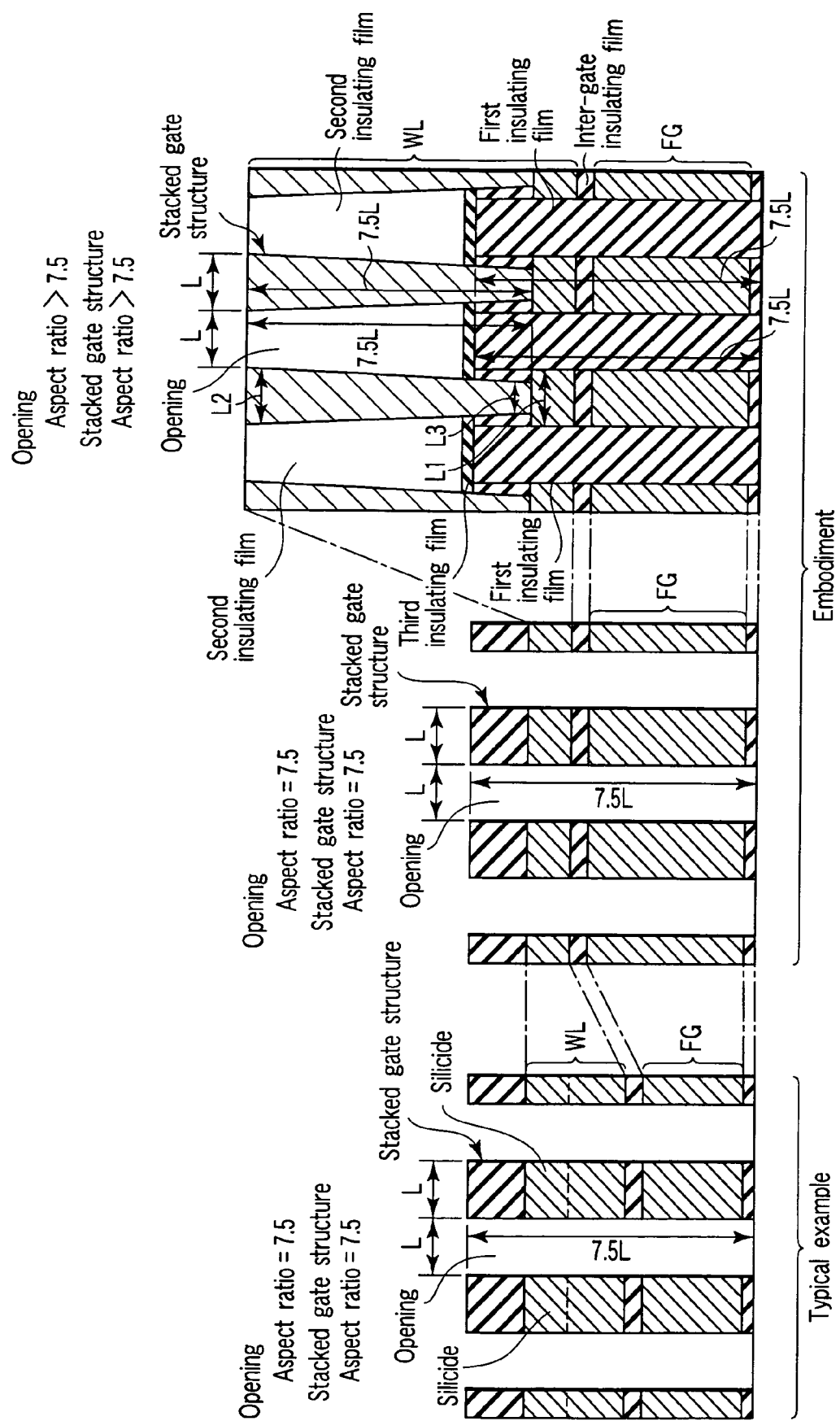
FIG. 32 is a cross sectional view showing the device according to this invention in comparison with a device of a typical example.

FIG. 32 is a cross sectional view showing the device according to the present embodiment in comparison with a device of a typical example. The cross section is viewed in the word line direction.

In the device of the typical example, stacked gate structures each containing a floating gate (FG), inter-gate insulating film and control gate (WL) are formed in one step.

On the other hand, in the device according to the present embodiment, stacked gate structures are formed stepwise. In this example, the stacked gate structures are formed in two steps.

Therefore, in the device according to the present embodiment, an advantage that the aspect ratio of the stacked gate structure in each manufacturing step can be set low in comparison with the device of the typical example can be attained. As a result, the device according to the present embodiment can be easily manufactured in comparison with the device of the typical example.

For example, since the stacked gate structure is formed in one step in the device of the typical example, the upper limit of the aspect ratio thereof is 7.5 in the case of mass-production. If an attempt is made to attain an aspect ratio which exceeds the above aspect ratio, the manufacturing yield is lowered and the stacked gate structure is not suitable for mass-production.

On the other hand, in the device according to the present embodiment, the aspect ratio of the stacked gate structure which exceeds 7.5 can be attained by forming the stacked gate structure to set the aspect ratio of the stacked gate structure in each manufacturing step to 7.5. That is, the stacked gate structure having the aspect ratio exceeding 7.5 can be formed while the stacked gate structure is made suitable for mass-production. For example, in the stacked gate structure having the aspect ratio exceeding 7.5, the cross sectional area of the word line can be made large, which is preferable in suppressing an increase in the resistance thereof.

Further, as shown by the device of the typical example, the upper limit of the aspect ratio of the opening between the stacked gate structures is 7.5 in the case of mass-production. If an attempt is made to attain an aspect ratio which exceeds the above aspect ratio, memory cell transistors can be densely arranged in the word line direction, but the manufacturing yield is lowered and the device is not suitable for mass-production.

On the other hand, in the device according to the present embodiment, the aspect ratio of the opening can be set to exceed 7.5 even in the case of mass-production. Therefore, according to the device of this embodiment, memory cell transistors can be more densely arranged in the word line direction in comparison with the device of the typical example while the device can be made suitable for mass-production.

Further, in the device according to the present embodiment, the inter-level insulating film which insulates the stacked gate structures from each other has a hierarchical structure. The inter-level insulating film of this example has a three-layered structure having first to third insulating films. The first insulating film insulates the floating gates from each other and portions of the control gates from each other. The second insulating film insulates the other portions of the control gates from each other. The third insulating film is provided between the first and second insulating films. For the third insulating film, a material having a selective etching ratio with respect to the first and second insulating films is selected.

Thus, in the device according to the present embodiment, when grooves used to form the control gates are formed in the second insulating film, the grooves can be stopped in the portion of the third insulating film. That is, formation of the grooves extending to the fist insulating film can be suppressed. If the groove is formed to extend to the first insulating film, the control gate and the floating gate are short-circuited. Such a state can be prevented and a device which can be easily manufactured is provided in the present embodiment.

The control gate of the device according to the present embodiment contains a first conductive film formed in contact with the inter-gate insulating film and a second conductive film electrically connected to the first conductive film.

It is possible to set the thickness of the first conductive film (the reference symbol H1 in FIGS. 6A to 6D) equal to or smaller than 1.5 times the width of the first conductive film in the gate width direction (the reference symbol L1 in FIGS. 4A to 4D) and the width thereof in the gate length direction (the reference symbol L1 in FIGS. 7A to 7D).

With the above device, an increase in the aspect ratio can be suppressed in a certain manufacturing step of the stacked agate structure, for example, in the first manufacturing step. Therefore, the device can be easily formed. Further, when the aspect ratio is fixed, for example, fixed at 7.5 as shown in FIG. 32, the floating gate can be made thick. If the floating gate can be formed thick, for example, a structure in which the side walls of the floating gate can be easily exposed in a step of exposing the side walls of the floating gate shown in FIGS. 5A to 5D can be attained. Alternatively, since the exposed area of the side wall can be increased, a structure which is advantageous in increasing the coupling capacity between the control gate and the floating gate can be attained.

When the top width of the first conductive film is L1, the top width of the second conductive film is L2 and the bottom width of the second conductive film is L3, the relation of "L2>L3" and "L1>L3" can be set.

In this case, if misalignment of the photomask occurs, for example, the second conductive film can be prevented from being deviated from the upper surface of the first conductive film. The advantage attained at this time is as explained with reference to FIGS. 31A to 31E.

Thus, according to the device of the present embodiment, a semiconductor integrated circuit device having a nonvolatile semiconductor memory device which is excellent in fine patterning processibility and in which the integration density of memory cell transistors can be enhanced while an increase in the resistance of the control gate (word line) is suppressed can be provided.

Second Embodiment

The second embodiment is different from the first embodiment in that the side walls of the floating gate are not exposed from the STI structure.

The second embodiment of this invention is explained together with the manufacturing method thereof.

FIGS. 12A to 19A are plan views each showing a memory cell array of a semiconductor integrated circuit device according to the second embodiment of this invention in each of the main manufacturing steps. FIGS. 12B to 19B are cross sectional views taken along the B-B lines of FIGS. 12A to 19A and FIGS. 12C to 19C are cross sectional views taken along the C-C lines of FIGS. 12A to 19A. FIGS. 12D to 19D are cross sectional views each showing a peripheral transistor of the semiconductor integrated circuit device in each of the main manufacturing steps.

First, a structure shown in FIGS. 12A to 12D is obtained by use of the method explained with reference to FIGS. 1A to 4D.

Next, as shown in FIGS. 13A to 13D, a photoresist is coated to form a photoresist film (not shown) on a silicon nitride film 4. Then, grooves corresponding to an STI formation pattern are formed in the photoresist film by use of the photolithography technique and the photoresist film is left behind in a pattern corresponding to an active area formation pattern. After this, the silicon nitride film 4 is patterned with the photoresist film used as a mask so that the pattern of the silicon nitride film 4 will correspond to the active area formation pattern. After the photoresist film is separated and removed, the substrate 1 is etched with the silicon nitride film 4 used as a mask to form shallow trenches in the substrate 1. Next, an insulating material, for example, silicon dioxide is deposited to form a silicon dioxide film above the substrate 1 in which the shallow trenches are formed. Then, the silicon dioxide film is subjected to the CMP process to fill silicon dioxide into the shallow trenches with the silicon nitride film 4 used as a stopper. Thus, STI structures are formed.

Next, as shown in FIGS. 14A to 14D, an inter-gate insulating film 5 is formed on the structure shown in FIGS. 13A to 13D. As the inter-gate insulating film 5 of this example, an insulating material having a dielectric constant larger than that of the inter-gate insulating film 5 of the first embodiment is selected. For example, an insulating material having a larger dielectric constant than that of the ONO film is selected. One example of the insulating film is alumina.

The steps performed after this may be the same as those of the first embodiment. Therefore, they are simply explained.

After the inter-gate insulating film 5 is formed, openings 7 are formed in the inter-gate insulating film 5. Then, a conductive polysilicon film 6 is formed on the inter-gate insulating film 5 having the openings 7 formed therein. Further, a cap film, in this example, a silicon nitride film 8 is formed on the conductive polysilicon film 6.

Next, as shown in FIGS. 15A to 15D, the silicon nitride film 8, conductive polysilicon film 6, inter-gate insulating film 5 and conductive polysilicon film 3 are subjected to the RIE process to form first stacked gate structures.

Then, as shown in FIGS. 16A to 16D, an N-type impurity, for example, phosphorus or arsenic is ion-implanted into the substrate 1 to form N-type diffusion layers 9 with the first stacked gate structures and STI structures used as a mask. On the structure obtained after the N-type diffusion layers 9 are formed, a silicon dioxide film 10 is formed. Next, the silicon dioxide film 10 is subjected to the RIE process to leave the silicon dioxide film 10 on the side walls of the first stacked gate structures. In this example, like the first embodiment, a space between the structure used as the gate of a block selection transistor and the structure used as the gate of a memory cell transistor and a space between the structures used as the gates of the memory cell transistors are filled with the silicon dioxide films 10. After this, an N-type impurity, for example, phosphorus or arsenic is ion-implanted into the substrate 1 to form N-type diffusion layers 11 with the first stacked gate structures, silicon dioxide films 10 and STI structures used as a mask. On the structure obtained after the N-type diffusion layers 11 are formed, a silicon nitride film 12 is formed. Then, an insulating film, for example, silicon dioxide is deposited on the silicon nitride film 12 to form a first-layered inter-level insulating film 13.

Next, as shown in FIGS. 17A to 17D, wiring grooves 14 are formed in the first-layered inter-level insulating film 13. Then, the etching process is performed to remove the silicon nitride films 12 and 8 (refer to FIGS. 18A to 18D). Thus, the wiring grooves 14 are formed in the first-layered inter-level insulating film 13 and silicon nitride films 12 and 8.

Next, as shown in FIGS. 18A to 18D, a conductive material, for example, tungsten is deposited to form a tungsten film 15 on the structure in which the wiring grooves 14 are formed. The tungsten film 15 is subjected to the CMP process to embed the tungsten film 15 into the wiring grooves 14.

Next, as shown in FIGS. 19A to 19D, a second-layered inter-level insulating film 16 is formed on the structure in which the tungsten films 15 are filled in the wiring grooves 14. Then, openings which reach the tungsten films 15 are formed in the second-layered inter-level insulating film 16 and openings which reach the diffusion layers 11 are formed in the second-layered and first-layered inter-level insulating films 16 and 13. The openings are filled with conductive materials such as tungsten films 17, 18.

After this, a semiconductor integrated circuit device according to the second embodiment is completed by sequentially forming bit lines, upper-layered wirings and the like by use of a known manufacturing method although not particularly shown in the drawing.

In the second embodiment, the same advantage as that of the first embodiment can be attained.

Third Embodiment

The third embodiment is different from the first embodiment in that the first conductive film (conductive polysilicon film 6) is divided for each memory cell transistor in the word line direction.

The third embodiment is explained together with the manufacturing method thereof.

FIGS. 20A to 29A are plan views each showing a memory cell array of a semiconductor integrated circuit device according to the third embodiment of this invention in each of the main manufacturing steps. FIGS. 20B to 29B are cross sectional views taken along the B-B lines of FIGS. 20A to 29A and FIGS. 20C to 29C are cross sectional views taken along the C-C lines of FIGS. 20A to 29A. FIGS. 20D to 29D are cross sectional views each showing a peripheral transistor of the semiconductor integrated circuit device in each of the main manufacturing steps.

First, a structure shown in FIGS. 20A to 20D is obtained by use of the method explained with reference to FIGS. 1A to 2D.

Next, as shown in FIGS. 21A to 21D, an inter-gate insulating film 5 is formed on a conductive polysilicon film 3. One example of the inter-gate insulating film 5 is a laminated film of silicon dioxide/silicon nitride/silicon dioxide which is a so-called ONO film. Then, openings 7 are formed in the inter-gate insulating film 5. A conductive material, for example, conductive polysilicon is deposited to form a conductive polysilicon film 6 on the inter-gate insulating film 5 in which the openings 7 are formed. After this, a cap film, in this example, a silicon nitride film 4 is formed on the conductive polysilicon film 6. The cap film is used as a mask in the etching process when shallow trenches are formed in the substrate 1 and used as a stopper in the polishing process when an insulating material is embedded into the shallow trenches, for example. Therefore, as the above material, a material having a selective etching ratio with respect to at least one of the substrate 1 and the insulating material embedded in the shallow trench is selected. One example of the material is silicon nitride. In this example, silicon nitride is deposited on the conductive polysilicon film 6, for example, to form a silicon nitride film 4.

Next, as shown in FIGS. 22A to 22D, a photoresist is coated on the silicon nitride film 4 to form a photoresist film (not shown). Then, grooves of a pattern corresponding to the STI formation pattern are formed in the photoresist film by use of the photolithography technique to leave the photoresist film in a pattern corresponding to an active area formation pattern. After this, the silicon nitride film 4 is patterned with the photoresist film used as a mask and the silicon nitride film 4 is formed in a pattern corresponding to the active area formation pattern. After the photoresist film is separated and removed, the conductive polysilicon film 6, inter-gate insulating film 5, conductive polysilicon film 3, gate insulating film 2 and substrate 1 are etched with the silicon nitride film 4 used as a mask to form shallow trenches in the substrate 1. Then, an insulating film, for example, silicon dioxide is deposited to form a silicon dioxide film above the substrate 1 in which the shallow trenches are formed. After this, the silicon dioxide film is subjected to the CMP process with the silicon nitride film 4 used as a stopper to fill silicon dioxide into the shallow trenches. Thus, STI structures are formed.

Next, as shown in FIGS. 23A to 23D, after the silicon nitride film 4 is removed, the STI structures are subjected to the CMP process to make the surface thereof flat.

Then, as shown in FIGS. 24A to 24D, a cap film is formed on the structure in which the STI surface is made flat. The cap film is used as a mask in the etching process when stacked gate structures are formed and used as a stopper in the etching process when an insulating material is embedded into between the stacked gate structures, for example. Therefore, as the above material, a material having a selective etching ratio with respect to at least one of the conductive material contained in the stacked gate structure and the insulating material embedded in between the stacked gate structures is selected. Further, in order to set back the STI structure between the stacked gate structures, it is preferable to select a material having a selective etching ratio with respect to the insulating material contained in the STI structure. One example of the material is silicon nitride. In this example, for example, silicon nitride is deposited on the conductive polysilicon films 6 and STI structures and a silicon nitride film 8 is formed as a cap film. A photoresist is coated on the silicon nitride film 8 to form a photoresist film (not shown). Then, the photoresist film is patterned by use of the photolithography technique to leave the photoresist film in a pattern corresponding to the word line formation pattern, block selection line formation pattern and gate formation pattern of peripheral transistors. After this, the silicon nitride film 8 is subjected to the RIE process with the photoresist film used as a mask. Then, the photoresist film is removed.

Next, as shown in FIGS. 25A to 25D, the conductive polysilicon films 6, inter-gate insulating films 5 and conductive polysilicon films 3 are subjected to the RIE process with the silicon nitride films 8 used as a mask to form first stacked gate structures.

The steps performed after this may be the same as those of the first embodiment. Therefore, they are simply explained.

As shown in FIGS. 26A to 26D, N-type impurity, for example, phosphorus or arsenic is ion-implanted into the substrate 1 with the first stacked gate structures and STI structures used as a mask to form N-type diffusion layers 9. Then, a silicon dioxide film 10 is formed on the structure obtained after the N-type diffusion layers 9 are formed. The silicon dioxide film 10 is subjected to the RIE process and the silicon dioxide film 10 is left behind on the side walls of the first gate stacked gate structures. In this example, like the first and second embodiments, a space between the structure used as the gate of a block selection transistor and the structure used as the gate of a memory cell transistor and a space between the structures used as the gates of the memory cell transistors are filled with the silicon dioxide films 10. After this, N-type impurity, for example, phosphorus or arsenic is ion-implanted into the substrate 1 to form N-type diffusion layers 11 with the first stacked gate structures, silicon dioxide films 10 and STI structures used as a mask. On the structure obtained after the N-type diffusion layers 11 are formed, a silicon nitride film 12 is formed. Then, an insulating material, for example, silicon dioxide is deposited on the silicon nitride film 12 to form a first-layered inter-level insulating film 13.

Next, as shown in FIGS. 27A to 27D, wiring grooves 14 are formed in the first-layered inter-level insulating film 13. Then, the etching process is continuously performed to remove the silicon nitride films 12 and 8 (refer to FIGS. 28A to 28D). Thus, wiring grooves 14 are formed in the first-layered inter-level insulating film 13 and silicon nitride films 12 and 8.

Next, as shown in FIGS. 28A to 28D, a conductive material, for example, tungsten is deposited to form a tungsten film 15 on the structure in which the wiring grooves 14 are formed. The tungsten film 15 is subjected to the CMP process to embed the tungsten film 15 into the wiring grooves 14.

Next, as shown in FIGS. 29A to 29D, a second-layered inter-level insulating film 16 is formed on the structure in which the tungsten films 15 are filled in the wiring grooves 14. Then, openings which reach the tungsten films 15 are formed in the second-layered inter-level insulating film 16 and openings which reach the diffusion layers 11 are formed in the second-layered and first-layered inter-level insulating films 16 and 13. The openings are filled with conductive materials such as tungsten films 17, 18.

After this, a semiconductor integrated circuit device according to the third embodiment is completed by sequentially forming bit lines, upper-layered wirings and the like by use of a known manufacturing method although not particularly shown in the drawing.

In the third embodiment, the same advantage as that of the first embodiment can be attained.

Further, according to the third embodiment, the first conductive film (conductive polysilicon film 6) is divided for each memory cell transistor in the word line direction. As a result, the inter-gate insulating film 5 lying between the first conductive film and the floating gate (conductive polysilicon film 3) can be divided for each memory cell transistor in the word line direction. Therefore, a leakage of charge from the floating gate via the inter-gate insulating film 5 can be suppressed. Thus, in the third embodiment, the advantage that the charge holding characteristic is better than that of the first embodiment can be attained.

This invention is explained by use of the first to third embodiments, but this invention is not limited to the first to third embodiments. This invention can be variously modified without departing from the technical scope thereof at the embodying stage.

Further, the above embodiments contain inventions of various stages and inventions of various stages can be extracted by adequately combining a plurality of constituents disclosed in one embodiment.

In addition, the above embodiments are explained based on an example in which this invention is applied to the NAND flash memory, but this invention is not limited to the NAND flash memory and can be applied to a flash memory other than the NAND flash memory. For example, this invention can be applied to an AND type, NOR type and the like. Further, a semiconductor integrated circuit device containing the flash memory, for example, a processor, system LSI or the like lies within the scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device, comprising:
a semiconductor substrate;
a first stacked gate structure formed on the semiconductor substrate and having a floating gate, inter-gate insulating film and control gate;
a second stacked gate structure formed on the semiconductor substrate and having a floating gate, inter-gate insulating film and control gate;
each control gate having a first conductive film which is in contact with a respective said inter-gate insulating film and a second conductive film electrically connected to the first conductive film;
an inter-level insulating film formed to insulate the first and second stacked gate structures from each other, the inter-level insulating film including a first insulating film, a second insulating film, and a third insulating film formed between the first and second insulating films and having a selective etching ratio with respect to the first and second insulating films, the first insulating film insulating the floating gates and first conductive films of the first and second stacked gate structures from each other and portions of the second conductive films of the first and second stacked gate structures from each other, and the second and third insulating films insulating the other portions of the second conductive films of the first and second stacked gate structures from each other;
the second conductive film of each control gate being provided within a groove provided in the second insulating film to be electrically connected to the respective first conductive film; and
a Shallow Trench Isolation (STI) structure formed between the first and second gate structures in a word line direction, wherein
a side surface of the first conductive film of each control gate is contacted with the STI structure in the word line direction and the second conductive film of the respective control gate is commonly used for the memory cell transistors in the word line direction.

2. The device according to claim 1, wherein an aspect ratio of a cross section of the first and second stacked gate structures in a bit line direction is higher than 7.5.

3. The device according to claim 1, wherein a relation of "L2>L3" and "L1>L3" is attained when a top width of the first conductive film of each control gate is set to L1, top width of the second conductive film of each control gate is set to L2 and bottom width of the second conductive film of each control gate is set to L3.

4. The device according to claim 3, wherein an aspect ratio of a cross section of the first and second stacked gate structures in a bit line direction is higher than 7.5.

5. The device according to claim 1, wherein a thickness of the first conductive film of each control gate is not larger than 1.5 times the width of the first conductive film in a gate width direction and width thereof in a gate length direction.

6. The device according to claim 5, wherein an aspect ratio of a cross section of the first and second stacked gate structures in a bit line direction is higher than 7.5.

7. The device according to claim 5, wherein a relation of "L2>L3" and "L1>L3" is attained when a top width of the first conductive film of each control gate is set to L1, top width of the second conductive film of each control gate is set to L2 and bottom width of the second conductive film of each control gate is set to L3.

8. The device according to claim 7, wherein an aspect ratio of a cross section of the first and second stacked gate structures in a bit line direction is higher than 7.5.

* * * * *